United States Patent [19]
Hashimoto

[11] Patent Number: 5,889,716
[45] Date of Patent: Mar. 30, 1999

[54] SEMICONDUCTOR MEMORY

[75] Inventor: Kiyokazu Hashimoto, Tokyo, Japan

[73] Assignee: NEC Corporation, Japan

[21] Appl. No.: 16,274

[22] Filed: Jan. 30, 1998

[30] Foreign Application Priority Data

Jan. 30, 1997 [JP] Japan ................................. 9-016882

[51] Int. Cl.$^6$ ............................... G11C 7/02; G11C 7/00; G11C 8/00
[52] U.S. Cl. .................... 365/207; 365/208; 365/189.05; 365/189.08; 365/230.06
[58] Field of Search .................... 365/207, 208, 365/189.05, 226, 189.08, 230.06

[56] References Cited

U.S. PATENT DOCUMENTS

| | | | |
|---|---|---|---|
| 4,751,681 | 6/1988 | Hashimoto | 365/207 |
| 5,179,539 | 1/1993 | Horiguchi et al. | 365/226 |
| 5,463,588 | 10/1995 | Chonan | 365/226 |

FOREIGN PATENT DOCUMENTS 62-257699  11/1987  Japan .

*Primary Examiner*—David C. Nelms
*Assistant Examiner*—Trong Phan
*Attorney, Agent, or Firm*—Foley & Lardner

[57] ABSTRACT

In a semiconductor memory storing multivalue information, a sense section includes a first latch receiving an output of a first differential amplifier in a sense amplifier, a second latch receiving an output of a second differential amplifier in the sense amplifier and an output of the first latch, and a third latch receiving an output of a third differential amplifier in the sense amplifier and an output of the second latch. When a selected memory cell has the lowest threshold, the output of the first latch becomes a low level, and correspondingly, the output of the second latch is forcibly brought to the low level in response to the low level of the output of the first latch, and then, the output of the third latch is forcibly brought to the low level in response to the low level of the output of the second latch. Therefore, even if the output of the second and third differential amplifiers varies because of power supply voltage noises, the data can be correctly read out without being influenced by the power supply voltage noises.

10 Claims, 15 Drawing Sheets

| SELECTED MEMORY CELL (THRESHOLD) | $E_1$ | $E_2$ | $E_3$ | $Dout_1$ | $Dout_2$ |
|---|---|---|---|---|---|
| $V_{T0}$ (0.5V) | 0 | 0 | 0 | 0 | 0 |
| $V_{T1}$ (1.3V) | 1 | 0 | 0 | 0 | 1 |
| $V_{T2}$ (2.0V) | 1 | 1 | 0 | 1 | 0 |
| $V_{T3}$ (4.0V) | 1 | 1 | 1 | 1 | 1 |

| SELECTED MEMORY CELL (THRESHOLD) | E₁ | E₂ | E₃ | Dout₁ | Dout₂ |
|---|---|---|---|---|---|
| $V_{T0}$ (0.5V) | 1 | 1 | 1 | 0 | 0 |
| $V_{T1}$ (1.3V) | 0 | 1 | 1 | 0 | 1 |
| $V_{T2}$ (2.0V) | 0 | 0 | 1 | 1 | 0 |
| $V_{T3}$ (4.0V) | 0 | 0 | 0 | 1 | 1 |

| MEMORY CELL POTENTIAL | INPUT TERMINAL | | | | DECODER OUTPUT |
|---|---|---|---|---|---|
| | A | B | C | E | |
| INITIAL VOLT. | 0 | 0 | 0 | 0 | 0 |
| INITIAL VOLT. | 0 | 0 | 0 | 1 | 0 |
| $V_3$ | 0 | 0 | 1 | 0 | 0 |
| $V_3$ | 0 | 0 | 1 | 1 | 1 |
| $V_2$ | 0 | 1 | 1 | 0 | 1 |
| $V_2$ | 0 | 1 | 1 | 1 | 0 |
| $V_1$ | 1 | 1 | 1 | 0 | 1 |
| $V_1$ | 1 | 1 | 1 | 1 | 1 |

SEMICONDUCTOR MEMORY

BACKGROUND OF THE INVENTION

1. Field of the Invention

The present invention relates to a semiconductor memory, and more specifically to a multivalue memory including memory cells mainly composed of insulated gate field effect transistors and capable of storing information of three or more values. In this specification, the insulated gate field effect transistor will be called a "MOSFET".

2. Description of Related Art

Referring to FIG. 12, there is shown a block diagram of a prior art semiconductor memory storing multivalue information, which is disclosed by for example Japanese Patent Application Pre-examination Publication No. JP-A-62-257699, (the content of which is incorporated by reference in its entirety into this application, and also an English abstract of JP-A-62-257699 is available from the Japanese Patent Office and the content of the English abstract JP-A-62-257699 is also incorporated by reference in its entirety into this application).

In the prior art semiconductor memory shown in FIG. 12, a function block 10 includes a memory cell array, an address decoder, and a sense amplifier (not shown in FIG. 12) and has a power supply voltage terminal VCC1, an input terminal VCC2 for receiving a reference potential VC and a data output terminal D which is connected to a data input terminal D of each of a first latch circuit 22, a second latch circuit 24 and a third latch circuit 26. Further, the function block 10 has address input terminals A1 to An, which are connected to address lines A1 to An, respectively.

A control circuit 10 controls a voltage of the reference potential VC, and also controls an operation timing of the latch amplifiers 22, 24 and 26 and an outputting timing of a decoder 30 connected to receive respective outputs of the latch circuits 22, 24 and 26.

Clock output terminals for outputting clock signals CK1, CK2 and CK3 of the control circuit 40 are connected to clock input terminals CK of the latch circuits 22, 24 and 26, respectively. A terminal St of the control circuit 40 is a terminal for receiving a signal for controlling whether or not the control circuit 40 should be activated. This circuit St is connected to an output of a NOR circuit 50, receiving a chip enable signal $\overline{CE}$ and an output enable signal $\overline{OE}$ (here, the upper bar means that a low level is active). Therefore, when both of the chip enable signal $\overline{CE}$ and the output enable signal $\overline{OE}$ are at the low level, the NOR circuit 50 outputs a high level signal to the terminal St of the control circuit 40, so as to activate the control circuit 40.

The memory cell array included in the function block 10 is constituted of a matrix of memory cells each capable of storing information of three or more values. In the following, an example of storing four values in each memory cell will be described. For example, in order to store four values in each memory cell, it can be exemplified (1) to set a threshold of a memory cell to four different levels; or
(2) to set a gate length (L) or a gate width (W) of a memory cell to four different values, thereby to set four different current values.

Here, the first named example will be described.

In the above referred Japanese patent publication, the threshold of the memory cell is changed by controlling the amount of electrons injected into a floating gate of the memory cell, but it is well known that the threshold of the memory cell can be also changed by controlling the amount of ions injected into a region directly under a gate of the memory cell.

Here, it is assumed that the lowest one of four thresholds thus set is VT0 (0.5 V), a second lowest threshold is VT1 (1.3 V), a third lowest threshold is VT2 (2.0 V), and the highest threshold is VT3 (4.0 V).

The sense amplifier included in the function block 10 operates to discriminate which of the four thresholds VT0 to VT3 corresponds to the threshold set in the memory cell selected by a given address.

FIG. 14 shows a relation between the reference potential and a potential on an internal node in the sense amplifier by using as a standard potential the potential on the internal node in the sense amplifier when the memory cell having the threshold VT0 is selected.

(1) When the memory cell having the threshold VT0 is selected, the potential on the internal node in the sense amplifier becomes the standard potential, and it is detected that this potential is lower than a reference potential V3b, and it is discriminated to be data (KL)=(00).

(2) When the memory cell having the threshold VT1 is selected, the potential on the internal node in the sense amplifier becomes V3, and it is detected that V3 is higher than the reference potential V3b and lower than a reference potential V2b, and it is discriminated to be data (KL)=(10).

(3) When the memory cell having the threshold VT2 is selected, the potential on the internal node in the sense amplifier becomes V2, and it is detected that V2 is higher than the reference potential V2b and lower than a reference potential V1b, and it is discriminated to be data (KL)=(01).

(4) When the memory cell having the threshold VT3 is selected, the potential on the internal node in the sense amplifier becomes V1, and it is detected that V1 is higher than a reference potential V1b, and it is discriminated to be data (KL)=11).

Referring to FIG. 15, there is shown a detailed circuit diagram of a part of the function block 10.

Reference Numeral 101 designates the memory cell array composed of the matrix of memory cells M11, ..., Mn1, ..., M1m, ..., Mnm. X1 to Xn are an output of an X address decoder (not shown) for designating an X address of the memory cell array 101, and Y1 to Ym are an output of a Y address decoder (not shown) for designating a Y address of the memory cell array 101. Each memory cell is set to assume any one of the thresholds VT0 to VT3 mentioned above.

Reference Numeral 103 designates a Y selector for selecting digit lines d1 to dm of the memory cell array 101. This selector 103 is constituted of N-channel enhancement MOSFETs (each called "NE-MOSFET") QY1 to QYm. The outputs X1 to Xn of the X address decoder are connected to word lines, respectively, so that one memory cell is located at each of intersections between the word lines and the digit lines in such a manner that each memory cell is connected between a corresponding digit line and the ground, and a gate of the memory cell is connected to a corresponding word line.

Reference Numeral 102 designates the sense amplifier, which includes a biasing circuit composed of a P-channel enhancement MOSFETs (called "PE-MOSFET") QS111, an NE-MOSFET QS112, and a feedback inverter IS111. The biasing circuit detects a cell current which changes dependently upon the threshold of the selected memory cell.

VSA3 designates the internal node as mentioned above in the sense amplifier. The potential on the internal node VSA3 is determined by a ratio of the current flowing through the selected memory cell to a current driving capability of the PE-MOSFET QS111.

Accordingly, if the threshold of the selected memory cell is VT0, a large cell current flows so that the potential on the internal node VSA3 drops and then balances with the standard potential shown in FIG. 14.

On the other hand, if the threshold of the selected memory cell is VT3, even if the power supply voltage (3 V) is applied to the gate of the selected memory cell, a cell current does not flow, so that the potential on the internal node VSA3 balances with V1 shown in FIG. 14.

When the threshold on the selected memory cell is VT1 or VT2, the potential on the internal node VSA3 is determined by the value of the cell current and balances with V3 or V2 shown in FIG. 14.

The sense amplifier 102 also includes a differential circuit composed of PE-MOSFETs QS121 and QS122 and NE-MOSFETs QS123, QS124 and QS125, and so configured to compare the potential on the internal node VSA3 with the reference potential VC and to amplify a difference therebetween.

For example, if the potential on the internal node VSA3 is higher than the reference potential VC, a potential on a node fA becomes a low level, with the result that an output D of an inverter IS112 becomes a high level.

On the other hand, if the potential on the internal node VSA3 is lower than the reference potential VC, the potential on the node fA becomes the high level, with the result that an output D of an inverter IS112 becomes the low level.

Referring to FIG. 16, there is a timing chart illustrating an operation of the control circuit 40 and potential changes on the internal node VSA3 and the outputs A, B and C of the latch circuits 22, 24 and 26 when the threshold of the selected memory cell is VT1.

Now, an operation of the prior art semiconductor memory storing the multivalue information will be described with reference to FIGS. 12 to 16.

If the high level signal is inputted to the terminal St of the control circuit 40 from the NOR circuit 50, the control circuit 40 starts to operate. The control circuit 40 elevates the reference potential VC stepwise to three different levels in the order of V3b, V2b and V1b, and outputs the clocks CK3, CK2 and CK1 in the order of CK3, CK2 and CK1 and in time with corresponding reference potentials V3b, V2b and V1b. After this sequential operation, the control circuit 40 outputs an output request signal OE to a gate input G of the decoder 30.

Each of the clocks CK3, CK2 and CK1 is set to have a pulse width T giving a sufficient time for data read out in each reference potential to be outputted to the data output terminal D of the function block 10.

Next, explanation will be made on an operation of the sense amplifier, the latch circuits and the decoder when the threshold of the selected memory cell is VT1.
(1) Time $t_1$ to $t_2$ In this period of time, an address is set, and the selected memory cell is determined. In accordance with the threshold (VT1 in this example) of the selected memory cell, a cell current flows, and this cell current is sensed by the sense amplifier so that the potential on the internal node VSA3 balances with V3.
(2) Time $t_2$ to $t_3$ In this period of time, the clock CK3 is brought to the high level so that the latch circuit 26 is activated. The value of the reference potential VC balances with the first reference potential V3b.

At this time, since it becomes VSA3<V3b, the potential of the output D of the sense amplifier becomes the high level. In this condition, since the latch circuit 26 is activated, the potential of the output D of the sense amplifier is transferred to the output of the latch circuit 26, with the result that the input C of the decoder 30 is brought to the high level as shown in FIG. 16. Here, for simplification of the description, it is assumed that the inputs A, B and C of the decoder circuit are set to the high level in an initial stage.
(3) Time $t_3$ to $t_4$ In this period of time, the clock CK2 is brought to the high level so that the latch circuit 24 is activated. The value of the reference potential VC elevates from the V3b and then balances with the second reference potential V2b.

At this time, since it becomes VSA3<V2b, the potential of the output D of the sense amplifier becomes the low level. In this condition, since the latch circuit 24 is activated, the potential of the output D of the sense amplifier is transferred to the output of the latch circuit 24, with the result that the input B of the decoder 30 is brought to the low level from the high level as shown in FIG. 16.
(4) Time $t_4$ to $t_5$ In this period of time, the clock CK1 is brought to the high level so that the latch circuit 22 is activated. The value of the reference potential VC elevates from the V2b and then balances with the third reference potential V1b.

At this time, since it becomes VSA3<V1b, the potential of the output D of the sense amplifier becomes the low level. In this condition, since the latch circuit 22 is activated, the potential of the output D of the sense amplifier is transferred to the output of the latch circuit 22, with the result that the input A of the decoder 30 is brought to the low level from the high level as shown in FIG. 16.
(5) After Time $t_5$ The output request signal OE is brought from the low level to the high level, so that the decoder 30 is put in an output enable condition. In this condition, since the data inputs A, B and C of the decoder are set to {001} until the time $t_5$, it is discriminated that the selected memory cell is set to have the threshold VT1 as shown in a logic value table of FIG. 13.

In the circuit shown in FIG. 12, since the decoder 30 has the output O of one bit, the data is outputted in a time-division manner. For the data of (KL)=(01) corresponding to the memory cell having the threshold VT1, first, a signal E applied to an input E of the decoder 30 is brought to "0", so that the data of "0" is outputted to the output O of the decoder 30, and then, the signal E is brought to "1", the data of "1" is outputted to the output O of the decoder 30. However, the decoder 30 can have a construction of outputting an output of two bits. In this case, it is possible to output the data of (KL)=(01) as $\overline{O1}$ and $\overline{O2}$.

Referring to FIG. 17, there is a timing chart illustrating an operation of the control circuit 40 and potential changes on the internal node VSA3 and the outputs A, B and C of the latch circuits 22, 24 and 26 when the threshold of the selected memory cell is VT1, similar to FIG. 16, but when the voltage VCC of the power supply CC varies because of noises in the period of time $t_4$ to $t_5$.

In general, in semiconductor memories, when each of various circuits switches, noises occur on the power supply voltage so that a potential of the power supply voltage varies.

Now, an operation in this situation will be described with FIGS. 15 and 17 to 19. Since various waveforms in an operation until time $t_4$ are the same as those shown in FIG. 16, explanation will be omitted.

(1) time $t_4$ to $t_5$

In the period of time $t_4$ to $t_5$, noises occur on the power supply voltage as shown in FIG. 17, so that the potential of the power supply voltage varies.

First, if the power supply voltage VCC elevates as in a period of time $t_{41}$, a power supply voltage of the feedback inverter IS111 in the sense amplifier 102 in FIG. 15 elevates. At this time, a number of Y selectors 103 is connected to a node SC, and therefore, a capacitance associated to the node SC is large (for example, 5 pF). Accordingly, the potential on the node SC is stable. As a result, the feedback inverter IS111 amplifies the potential variation of the power supply voltage VCC, so that the potential on a node SB, which is the output of the feedback inverter IS111, greatly elevates, with the result that QS112 is turned on, and therefore, the potential of the node SA3 greatly drops as shown in the waveform VSA3 in FIG. 17.

To the contrary, if the power supply voltage VCC drops as in a period of time $t_{42}$, the power supply voltage of the feedback inverter IS111 in the sense amplifier 102 in FIG. 15 drops. At this time, because of the reason mentioned above, the feedback inverter IS111 amplifies the potential variation of the power supply voltage VCC, so that the potential on the node SB greatly drops, with the result that QS112 is turned off, and therefore, the potential of the node SA3 greatly elevates as shown in the waveform VSA3 in FIG. 17. Thereafter, if the variation in the power supply voltage subsides, the potential of the node SA3 returns to the balanced level.

Here, if the potential of the node SA3 drops, the node SA3 is charged through QS111. However, since the current driving capacity of QS111 is determined taking the value of the cell current into consideration, the current driving capacity of QS111 is ordinarily small, and therefore, the charging speed of the node SA3 is low.

Referring to FIG. 18, there is shown a circuit diagram of one example of the reference potential generating circuit. Reference Numeral 81 designates a circuit for generating the first reference potential V3b. This circuit 81 is composed of NE-MOSFETs QR11 and QR12 series-connected between the power supply voltage VCC and the ground, a connection node between the NE-MOSFETs QR11 and QR12 being connected the terminal VC through a transfer gate composed of a PE-MOSFET QR13 and an NE-MOSFET QR14 connected in parallel to each other and controlled by a pair of complementary pulses $\phi_1$ and $\phi_{1B}$. Therefore, the first reference potential V3b is determined by a threshold of the NE-MOSFET QR12, as shown in the following equation (1).

$$V3b=VTN \tag{1}$$

Here, for simplification of description, it is considered that the threshold of all NE-MOSFETs is the same and expressed by VTN.

In addition, in order that the value of V3b does not have a dependency upon the power supply voltage as shown in FIG. 19, it is designed that the current driving capacity of QR12 in sufficiently larger than that of QR11.

Reference Numeral 82 designates a circuit for generating the second reference potential V2b. This circuit 82 is composed of NE-MOSFETs QR21, QR22 and QR23 series-connected between the power supply voltage VCC and the ground, a connection node between the NE-MOSFETs QR21 and QR22 being connected the terminal VC through a transfer gate composed of a PE-MOSFET QR24 and an NE-MOSFET QR25 connected in parallel to each other and controlled by a pair of complementary pulses $\phi_2$ and $\phi_{2B}$. Therefore, the second reference potential V2b is determined by a threshold of the NE-MOSFETs QR22 and QR23, as shown in the following equation (2).

$$V2b=2 \cdot VTN \tag{2}$$

Here, in order that the value of V2b does not have a dependency upon the power supply voltage as shown in FIG. 19, it is designed that the current driving capacity of QR22 and QR23 is sufficiently large than that of QR21.

Reference Numeral 83 designates a circuit for generating the first reference potential V1b. This circuit 83 is composed of NE-MOSFETs QR31, QR32, QR33 and QR34 series-connected between the power supply voltage VCC and the ground, a connection node between the NE-MOSFETs QR31 and QR32 being connected the terminal VC through a transfer gate composed of a PE-MOSFET QR35 and an NE-MOSFET QR36 connected in parallel to each other and controlled by a pair of complementary pulses $\phi_3$ and $\phi_{3B}$. Therefore, the third reference potential V1b is determined by a threshold of the NE-MOSFETs QR32, QR33 and QR34, as shown in the following equation (3).

$$V2b=3 \cdot VTN \tag{3}$$

Here, in order that the value of V1b does not have a dependency upon the power supply voltage as shown in FIG. 19, it is designed that the current driving capacity of QR32, Q33 and QR34 is sufficiently larger than that of QR31.

Since the reference potential generating circuit is designed as mentioned above, even if the power supply voltage varies as shown in FIG. 17, the reference potential almost never varies.

In the period of time $t_4$ to $t_5$, accordingly, VSA3 should be smaller than VC, but if the power supply voltage noise occurs, VSA3 becomes larger than VC, with the result that the output A of the latch circuit 22 changes from the low level to the high level. Namely, an erroneous operation occurs.

(2) After Time $t_5$

Thus, the input data (ABC) of the decoder 30 is set to (101) until time $t_5$. As seen from the logic value table of FIG. 13, this condition is not allocated in the logic table, and therefore, it is not possible to correctly discriminate that the selected memory cell is set to have the threshold VT1.

The above mentioned example is that the selected memory cell has the threshold VT1 and the power supply voltage noise occurs in the period of time $t_4$ to $t_5$. However, when the selected memory cell has the threshold VT0, if the power supply voltage noise occurs in the period of time $t_3$ to $t_4$ or in the period of time $t_4$ to $t_5$, the potential of the node SA3 varies as the waveform of VSA3 in FIG. 17, and an erroneous operation occurs. Therefore, a data reading cannot be normally performed when the selected memory cell having the threshold VT0 is selected.

In order to overcome this disadvantage, it is considered to elongate the high level period T of each clock. However, this results in delay of the timing where the output request signal OE changes from the low level to the high level. Therefore, the reading speed becomes slow.

As mentioned above, a first problem of the prior art is too sensitive to the power supply voltage noise, because, if the power supply voltage noise occurs, the internal node potential VSA3 of the sense amplifier greatly varies to become higher than the reference potential VC, with the result that the erroneous reading occurs.

A second problem of the prior art is that the reading speed becomes slow if an attempt is made to eliminate the first problem of the prior art. Because, it is necessary to elongate the high level period T of each clock.

SUMMARY OF THE INVENTION

Accordingly, it is an object of the present invention to provide a semiconductor memory which has overcome the above mentioned defects of the conventional one.

Another object of the present invention is to provide a multivalue information storing semiconductor memory that is resistant to the power supply voltage noises with no necessity of lowering the reading speed, the multivalue information storing semiconductor memory being otherwise prone to erroneous operation because of the power supply voltage noise.

The above and other objects of the present invention are achieved in accordance with the present invention by a semiconductor memory including a memory cell array, an X decoder, a Y decoder/Y switch, a sense section and a timing signal generator, the sense section including first, second and third differential circuits which operate at a timing different from each other in a time-division manner, and first, second and third latches for latching an output of the first, second and third differential circuits, respectively, the first, second and third latches being connected in such a manner that the second latch is fixed in accordance with a predetermined output level of the first latch, and the third latch is fixed in accordance with a predetermined output level of the second latch.

In one embodiment, the predetermined output level is a low level. In another embodiment, the predetermined output level is a high level.

In still another embodiment, the second differential circuit is activated by an output of the first latch, and the third differential circuit is activated by an output of the second latch.

For example, the memory cell array includes a plurality of memory cells, each of which is set to have a threshold corresponding to any one of first, second, third and fourth thresholds, and wherein the memory cell array includes a plurality of word lines, a selected one of which is alternatively supplied in order with a first word line voltage, a second word line voltage and a third word line voltage, the first word line voltage being set to be between the first and second thresholds, the second word line voltage being set to be between the second and third thresholds, and the third word line voltage being set to be between the third and fourth thresholds.

According to another aspect of the present invention, there is provided a semiconductor memory comprising:

a memory cell array includes a plurality of word lines, a plurality of digit lines and a plurality of memory cells located at intersections between the word lines and the digit lines;

a timing signal generator for generating a first clock, a second clock and a third clock in order at different timings, respectively;

an X decoder receiving a given X address, for determining a word line to be selected in accordance with the given X address, the X decoder driving the selected word line with a first word line voltage, a second word line voltage and a third word line voltage in synchronism with the first clock, the second clock and the third clock, respectively, in a time-division manner;

a Y decoder/Y switch circuit receiving a given Y address, for determining a digit line to be selected in accordance with the given Y address; and a sense section receiving a signal on the digit line selected by the Y decoder/Y switch circuit, and controlled by the first, second and third clocks to process the received signal, for outputting information stored in a selected memory cell designated by the given X address and the given Y address, to an output terminal at a timing designated by an output enable signal, the sense section including:

a biasing means connected to the digit line selected by the Y decoder/Y switch circuit, for generating an output voltage changing in accordance with a current flowing through the selected memory cell;

a first differential amplifying circuit activated by the first clock to compare the output voltage of the biasing means with a reference potential and to amplify a difference therebetween;

a second differential amplifying circuit activated by the second clock to compare the output voltage of the biasing means with the reference potential and to amplify a difference therebetween;

a third differential amplifying circuit activated by the third clock to compare the output voltage of the biasing means with the reference potential and to amplify a difference therebetween;

a first latch receiving an output of the first differential amplifying circuit, for latching the output of the first differential amplifying circuit in synchronism with the first clock;

a second latch receiving an output of the second differential amplifying circuit, for latching the output of the second differential amplifying circuit in synchronism with the second clock, the second latch being also controlled by an output of the first latch in such a manner that when the output of the first latch is at a predetermined level, an output of the second latch is also fixed to the predetermined level;

a third latch receiving an output of the third differential amplifying circuit, for latching the output of the third differential amplifying circuit in synchronism with the third clock, the third latch being also controlled by the output of the second latch in such a manner that when the output of the second latch is at the predetermined level, an output of the third latch is also fixed to the predetermined level; and a decoder circuit receiving the outputs of the first, second and third latches for decoding the outputs of the first, second and third latches into information of two bits, the decoder circuit outputting the information of two bits to the output terminal in response to the output enable signal.

In a first embodiment, the second latch is controlled by the output of the first latch in such a manner that when the output of the first latch is at a low level, the output of the second latch is fixed to the low level, and the third latch is controlled by the output of the second latch in such a manner that when the output of the second latch is at the low level, the output of the third latch is fixed to the low level.

In a second embodiment, the second latch is controlled by the output of the first latch in such a manner that when the output of the first latch is at a high level, the output of the second latch is fixed to the high level, and the third latch is controlled by the output of the second latch in such a manner that when the output of the second latch is at the high level, the output of the third latch is fixed to the high level.

In a third embodiment, the second differential amplifying circuit is activated by the output of the first latch in place of the second clock, and the third differential amplifying circuit is activated by the output of the second latch in place of the third clock.

For example, each of the plurality of memory cells is set to have a threshold corresponding to any one of first, second, third and fourth thresholds, and wherein the first word line voltage is set to be between the first and second thresholds, the second word line voltage is set to be between the second and third thresholds, and the third word line voltage is set to be between the third and fourth thresholds.

With the above mentioned arrangement, the second latch is supplied with the output of the first latch, and the third latch is supplied with the output of the second latch. For example, in the first embodiment, therefore, when the selected memory cell has the first threshold, the output of the first latch becomes a low level, and correspondingly, the output of the second latch is forcibly brought to the low level in response to the low level of the output of the first latch, and then, the output of the third latch is forcibly brought to the low level in response to the low level of the output of the second latch. Therefore, even if the output of the second and third differential amplifiers varies because of power supply voltage noises, the data can be correctly read out without being influenced by the power supply voltage noises.

In addition, when the selected memory cell has the second threshold, the output of the second latch becomes a low level, and correspondingly, the output of the third latch is forcibly brought to the low level in response to the low level of the output of the second latch. Therefore, even if the output of the third differential amplifier varies because of power supply voltage noises, the data can be correctly read out without being influenced by the power supply voltage noises.

Accordingly, during a period in which the second and third differential amplifiers are put in an active condition, even if the power supply voltage noises occur with the result that the second and third differential amplifiers cause an erroneous operation, the data can be correctly read out without being influenced by the power supply voltage noises. Namely, the semiconductor memory in accordance with the present invention operates normally without being influenced by the power supply voltage noises.

In addition, when the activation and deactivation of the second differential amplifier is controlled by the output of the first latch and the activation and deactivation of the third differential amplifier is controlled by the output of the second latch, the semiconductor memory in accordance with the present invention operates with a reduced current consumption.

The above description of operation is of the first embodiment in which when the output of a preceding latch is at the low level, the output of a succeeding latch is fixed to the low level. However, the description is also true in the second embodiment that when the output of a preceding latch is at the high level, the output of a succeeding latch is fixed to the high level.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the semiconductor memory in accordance with the present invention will be described with reference to the accompanying drawings.

Figure 1:
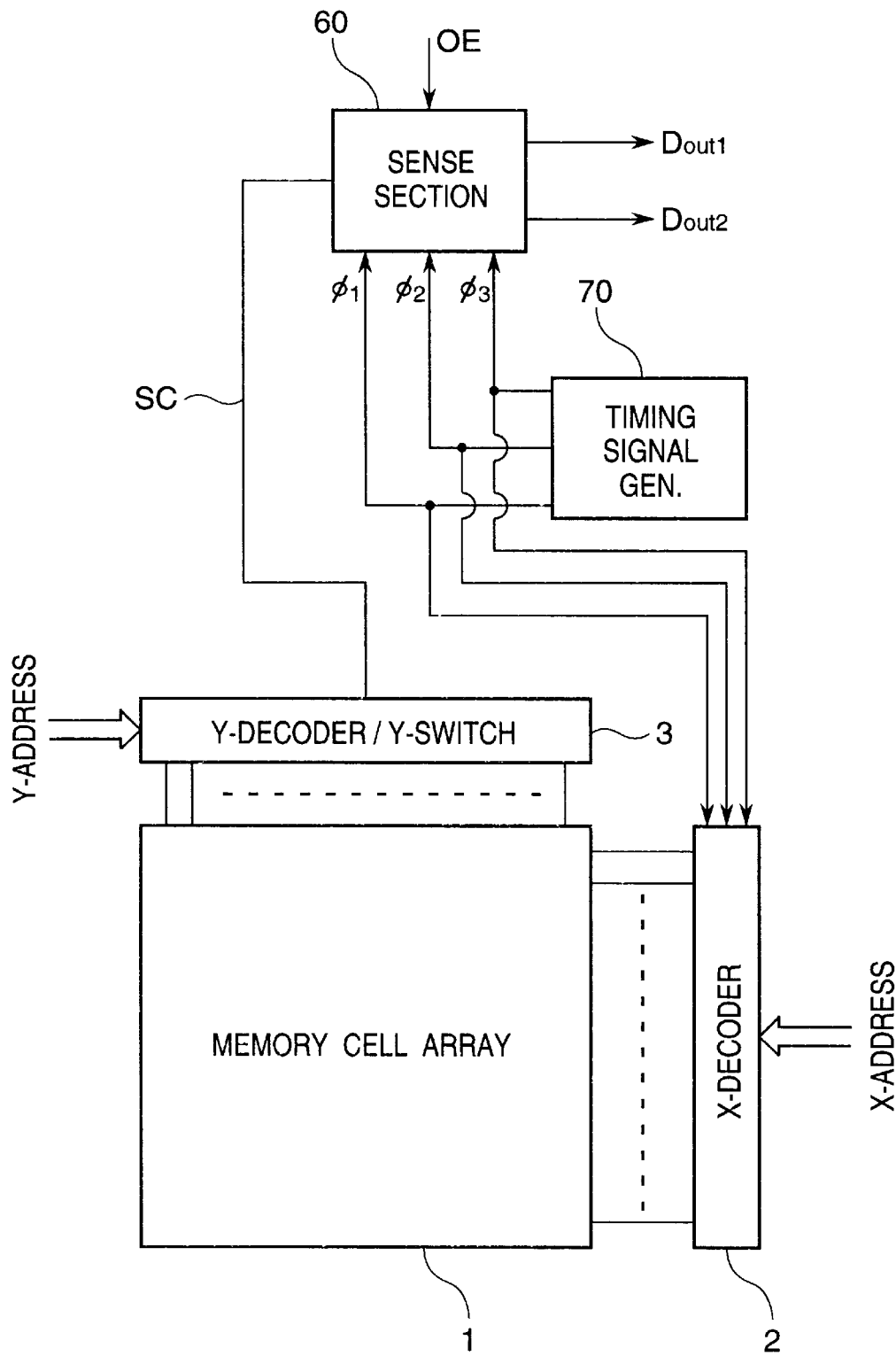
FIG. 1 is a block diagram of a first embodiment of the semiconductor memory in accordance with the present invention for storing multivalue information.
Figure 15:
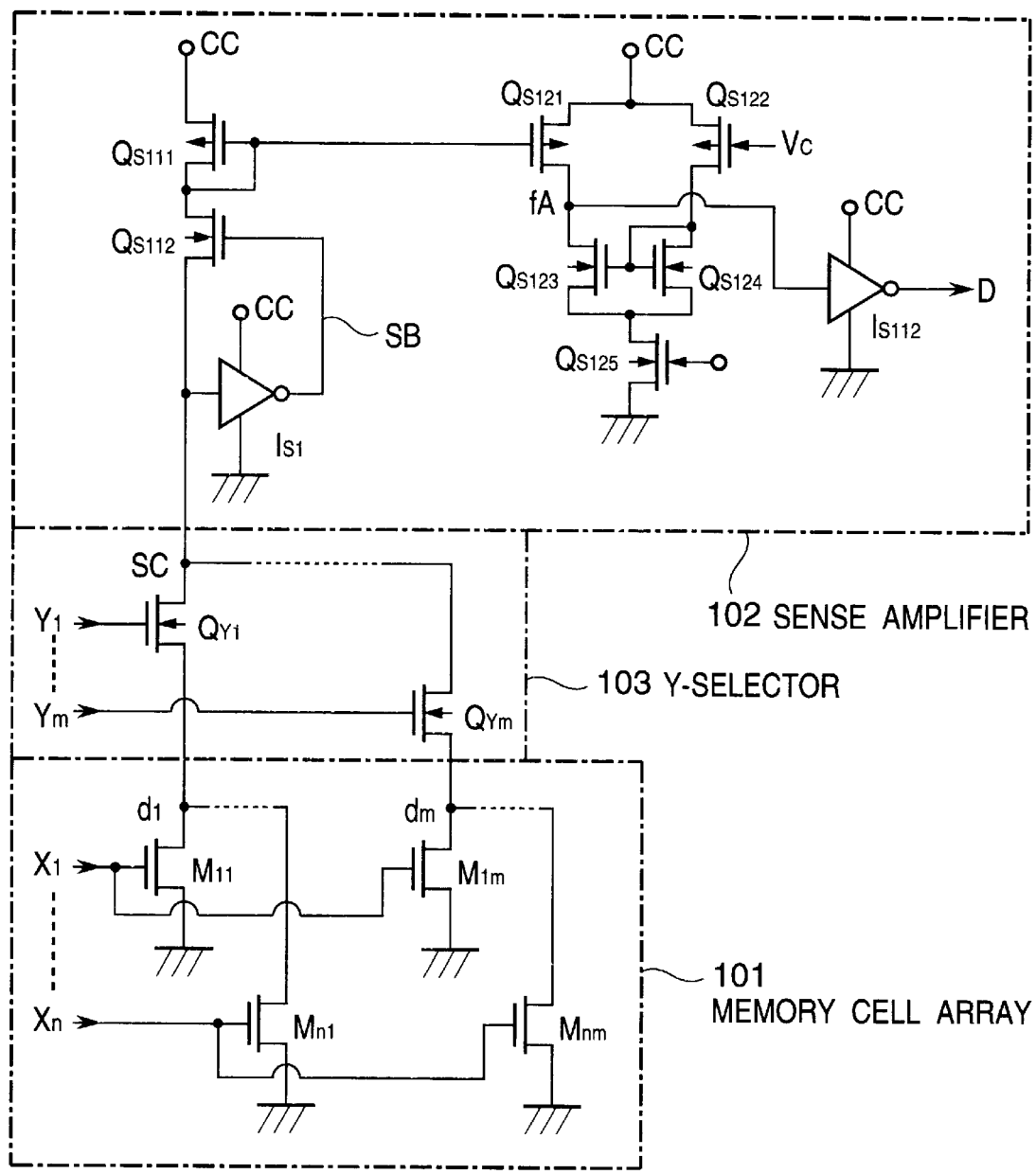
FIG. 15 is a detailed circuit diagram of a part of the function block included in the prior art semiconductor memory shown in FIG. 12.
Figure 16:
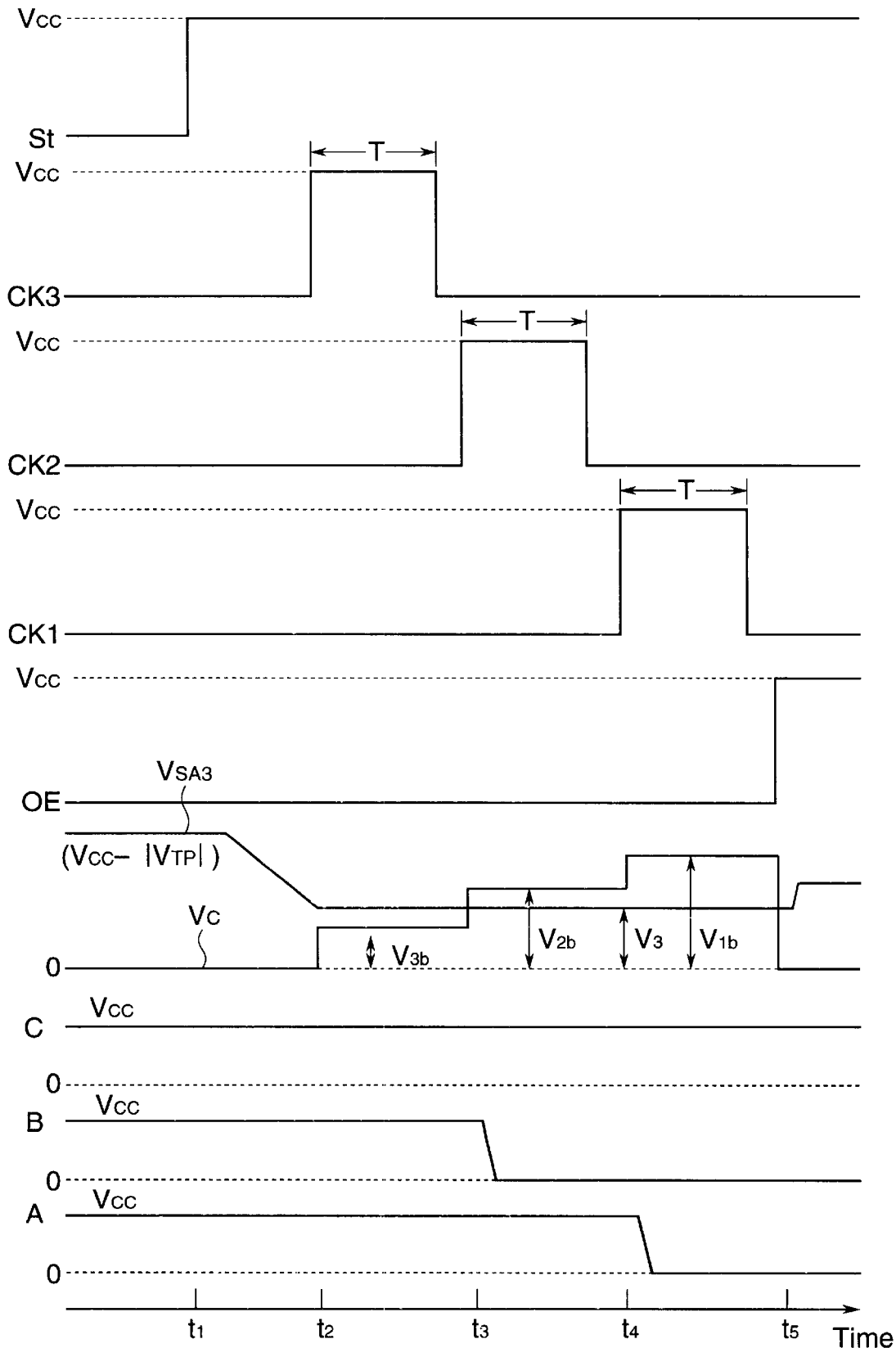
FIG. 16 is a timing waveform diagram illustrating an operation of the prior art semiconductor memory.
Figure 17:
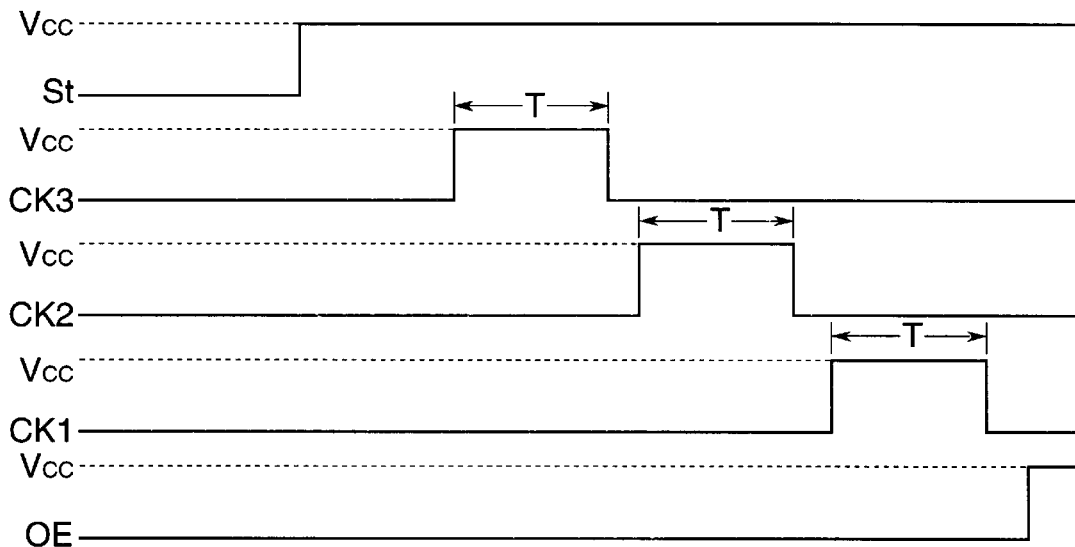
FIG. 17 is a timing waveform diagram illustrating an operation of the prior art semiconductor memory, in the case that the power supply voltage varies because of noises when the memory cell having the threshold VT1 is selected.
Figure 17:
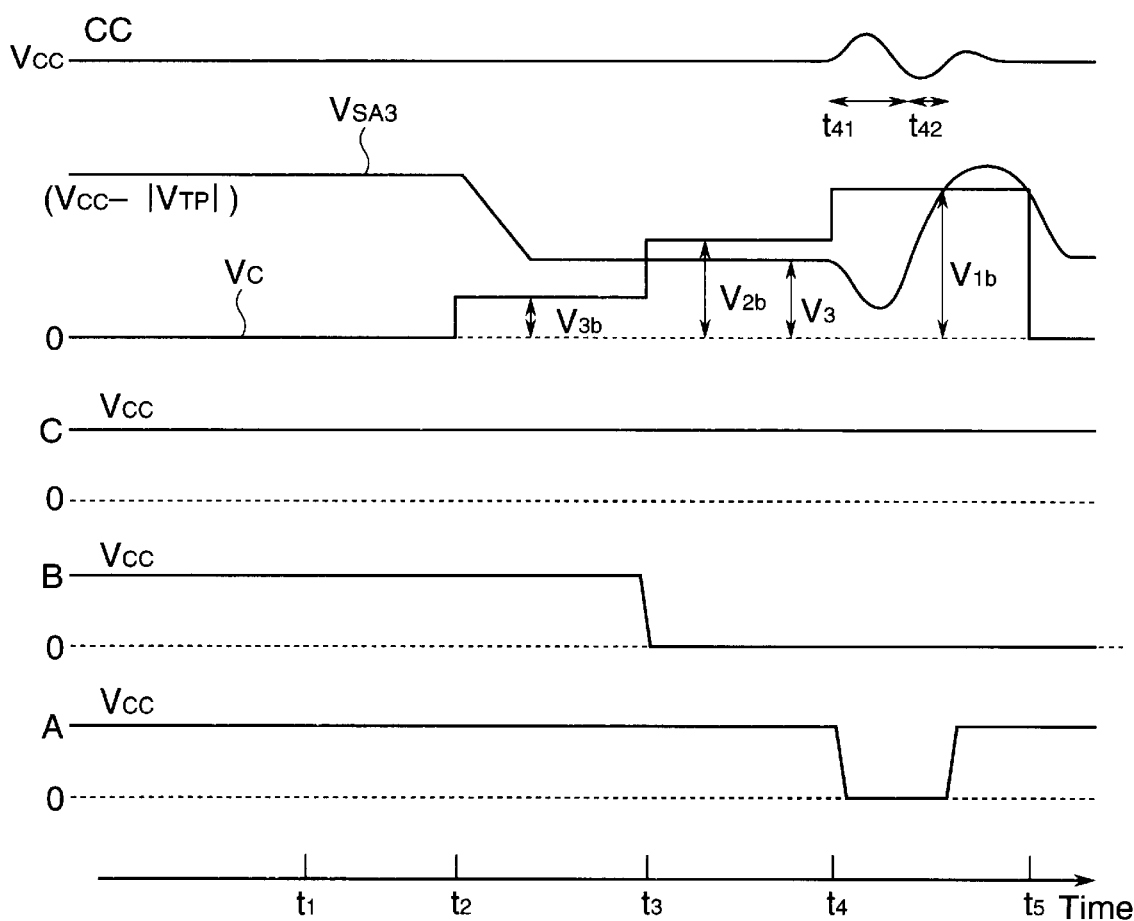
Figure 18:
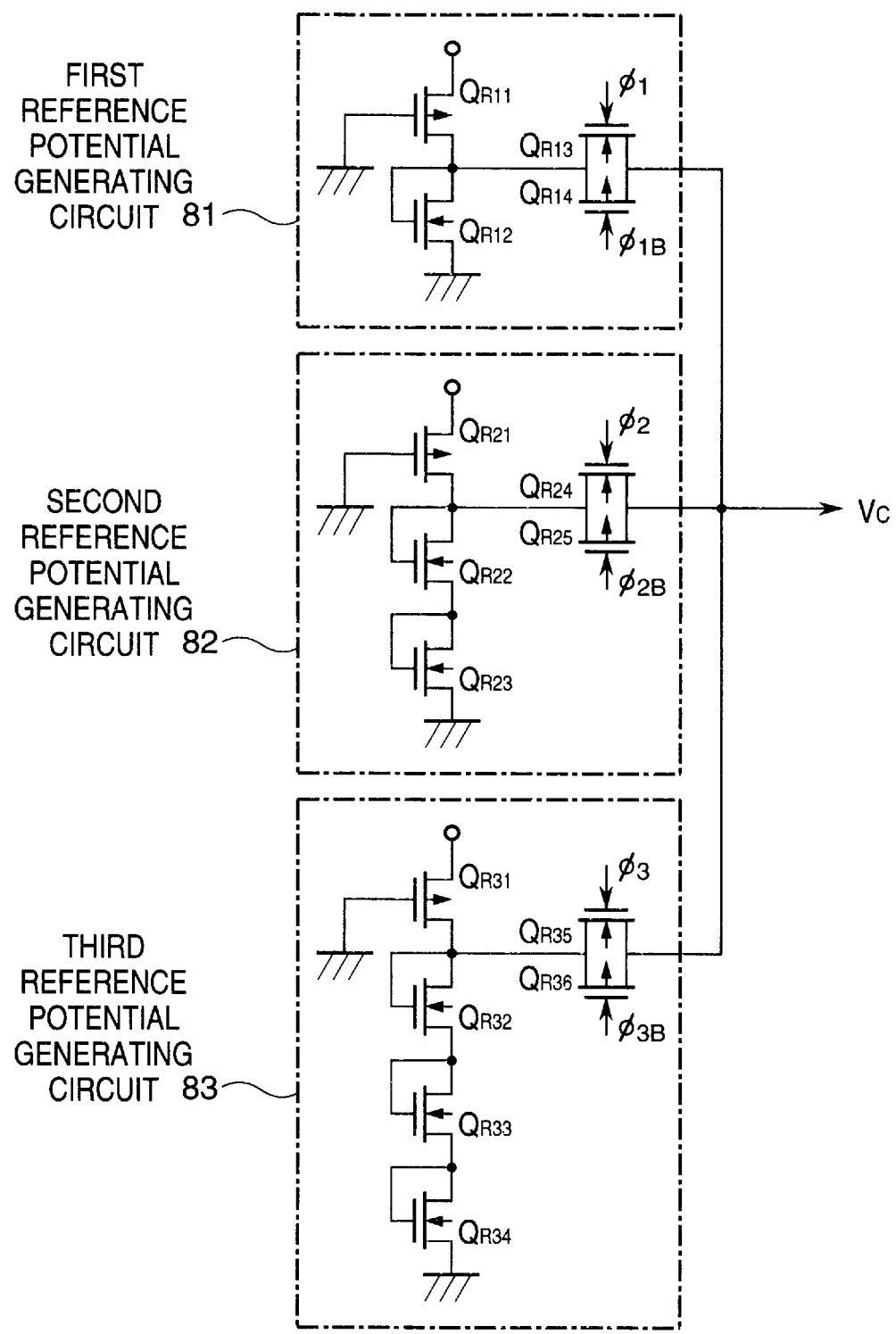
FIG. 18 is a circuit diagram showing one example of the reference potential generating circuit included in the control circuit of the prior art semiconductor memory shown in FIG. 12.

Referring to FIG. 1, which is a block diagram of a first embodiment of the semiconductor memory in accordance with the present invention for storing multivalue information, the semiconductor memory includes a memory cell array 1 constituted of a matrix of memory cells (not shown in FIG. 1), similarly to the memory cell array 101 shown in FIG. 15 of the prior art semiconductor memory.

Each of the memory cells is set to have any one of thresholds VT0 to VT3. The semiconductor memory also includes an X decoder 2 responding to a given X address for determining an X address of the memory cell to be selected. The X decoder 2 has a plurality of output lines connected to word lines of the memory cell array 1, respectively. The semiconductor memory further includes a Y decoder/Y switch 3 responding to a given Y address for determining a Y address of the memory cell to be selected. The Y decoder/Y switch 3 has a plurality of selection lines connected to digit lines of the memory cell array 1, respectively, and determines the digit line connected to the memory cell to be selected, in response to the given Y address.

A sense section 60 includes a sense amplifier, a latch circuit and a decoder (not shown in FIG. 1) and operates to detect and read out information stored in the memory cell which is selected by a given address and which has the threshold corresponding to any one of the VT0, VT1, VT2 and VT3. The sense section 60 has an input connected to an output of the Y decoder/Y switch 3 and a pair of data outputs Dout1 and Dout2. A timing signal generator 70 generates various timing clocks $\phi_1$, $\phi_2$ and $\phi_3$, for controlling an operation of various circuits included in the sense section 60. The timing clocks $\phi_1$, $\phi_2$ and $\phi_3$ are supplied to the X decoder 2 and the sense section 60.

Figure 2:
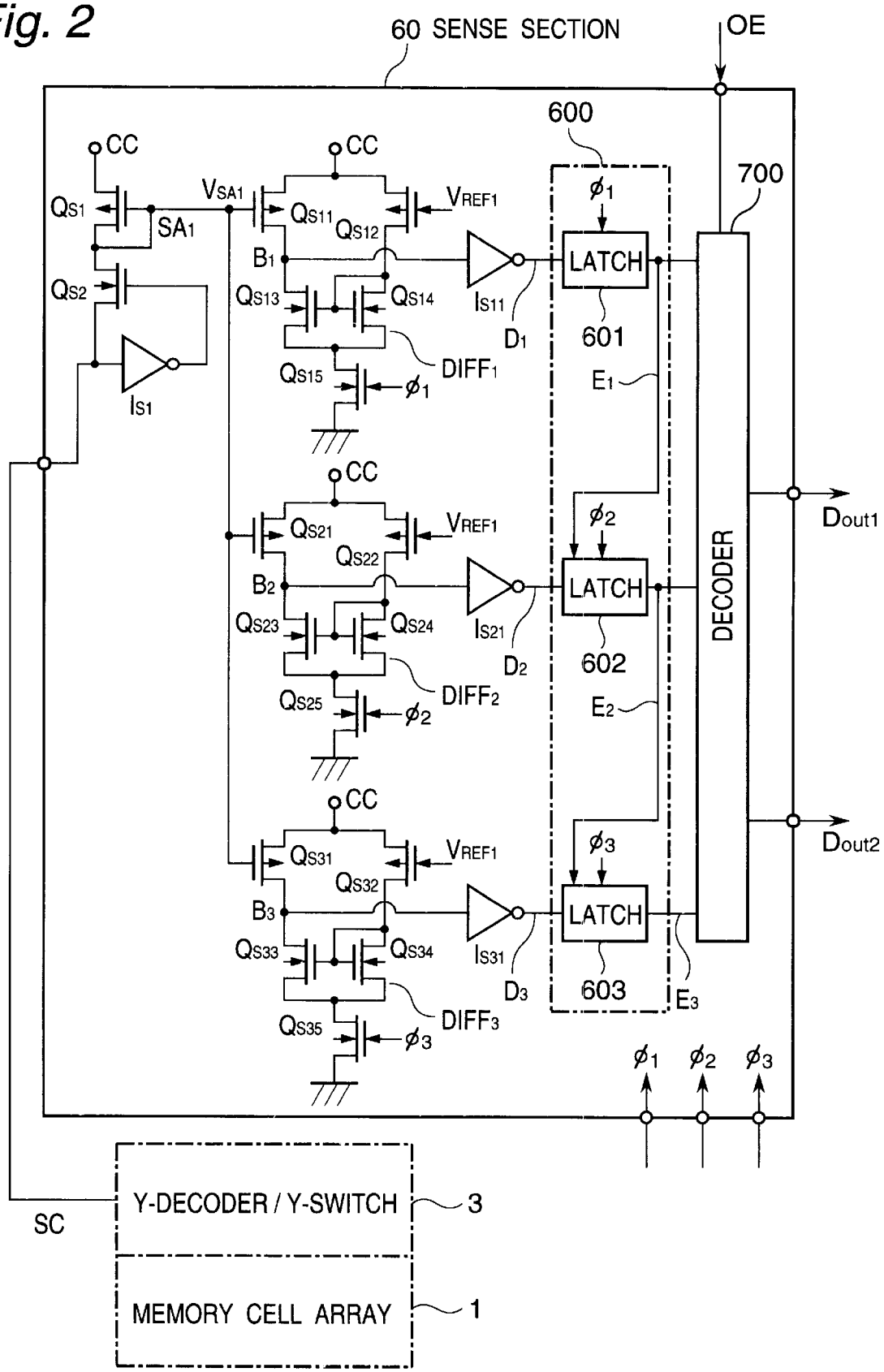
FIG. 2 is a circuit diagram of the sense section included in the semiconductor memory shown in FIG. 1.

Referring to FIG. 2, there is shown a detailed circuit diagram of the sense section 60 included in the semiconductor memory shown in FIG. 1. In FIG. 2, elements corresponding to those shown in FIG. 1 are given the same Reference Numerals and Signs.

The sense section 60 includes a biasing circuit composed of a PE-MOSFET QS1, an NE-MOSFET QS2 and a feedback inverter IS1. The PE-MOSFET QS1 and the NE-MOSFET QS2 are connected in series between a power supply voltage terminal CC and the input node SC of the sense section 60. The feedback inverter IS1 has an input connected to the input SC of the sense section 60, namely, a source of the NE-MOSFET QS2, and an output connected to a gate of the NE-MOSFET QS2. A gate of the PE-MOSFET QS1 is connected to a drain of the PE-MOSFET QS1, and a connection node between the PE-MOSFET QS1 and the NE-MOSFET QS2 constitutes an internal node SA1 of the sense amplifier. With this arrangement, the biasing circuit biases the input node SC and therefore the selected digit line to a predetermined biasing voltage.

The value of the voltage VSA1 on the internal node SA1 is determined by a ratio of a current driving capacity of the PE-MOSFET QS1 to the current flowing through a selected memory cell. Namely, if the threshold of the selected memory cell is higher than the voltage of the word line, the memory cell is in a non-conductive condition, and therefore, the value of the voltage VSA1 balances with the following equation (4):

$$VSA1 = VCC - |VTP| \quad (4)$$

where VTP is the threshold of the PE-MOSFET QS1.

On the other hand, if the threshold of the selected memory cell is lower than the voltage of the word line, the memory cell is in a conductive condition, and the value of the voltage VSA1 balances with the following equation (5):

$$VSA1 = VCC - |VTP| - \alpha \quad (5)$$

where $\alpha$ is determined by the ratio of the current driving capacity of the PE-MOSFET QS1 to the current flowing through a selected memory cell.

The sense section 60 also includes a first differential circuit DIFF1 composed of PE-MOSFETs QS11 and QS12 and NE-MOSFETs QS13, QS14 and QS15. The NE-MOSFET QS15 has a source connected to ground and a gate connected to a first activation signal $\phi_1$. The PE-MOSFET QS11 and the NE-MOSFET QS13 are connected in series between the power supply voltage terminal CC and a drain of the NE-MOSFET QS15, and the PE-MOSFET QS12 and the NE-MOSFET QS14 are also connected in series between the power supply voltage terminal CC and a drain of the NE-MOSFET QS15. A gate of the NE-MOSFET QS14 is connected to a gate of the NE-MOSFET QS13 and a drain of the NE-MOSFET QS14 itself. A gate of the PE-MOSFET QS11 is connected to the output SA1 of the biasing circuit, and a gate of the PE-MOSFET QS12 is connected to receive a reference voltage VREF1.

A circuit for generating the reference voltage VREF1 is not shown, but can be realized by adding a dummy cell to the biasing circuit in the sense section 60.

The first differential circuit DIFF1 compares the potential VSA1 on the internal node SA1 with the reference voltage VREF1, and amplifies a difference therebetween. When VSA1>VREF1, a node B1 between the PE-MOSFET QS11 and the NE-MOSFET QS13 becomes a low level, and when VSA1<VREF1, the node B1 becomes a high level. The node B1 constitutes an output of the first differential circuit DIFF1, and is connected to an inverting amplifier IS11, which outputs an inverted signal of the voltage of the output B1 of the first differential circuit DIFF1, to an output node D1.

PE-MOSFETs QS21 and QS22 and NE-MOSFETs QS23, QS24 and QS25 are connected as shown similarly to the first differential circuit DIFF1, to constitute a second differential circuit DIFF2. A gate of the PE-MOSFET QS21 is connected to the output SA1 of the biasing circuit, and a gate of the PE-MOSFET QS22 is connected to receive a reference voltage VREF1. A gate of the NE-MOSFET QS25 is connected to a second activation signal $\phi_2$.

The second differential circuit DIFF2 compares the potential VSA1 with the reference voltage VREF1, and amplifies a difference therebetween. When VSA1>VREF1, a node B2 between the PE-MOSFET QS21 and the NE-MOSFET QS23 becomes a low level, and when VSA1<VREF1, the node B2 becomes a high level. The node B2 constitutes an output of the second differential circuit DIFF2, and is connected to an inverting amplifier IS21, which outputs an inverted signal of the voltage of the output B2 of the second differential circuit DIFF2, to an output node D2.

PE-MOSFETs QS31 and QS32 and NE-MOSFETs QS33, QS34 and QS35 are connected as shown similarly to the first differential circuit DIFF1, to constitute a third differential circuit DIFF3. A gate of the PE-MOSFET QS31 is connected to the output SA1 of the biasing circuit, and a gate of the PE-MOSFET QS32 is connected to receive a reference voltage VREF1. A gate of the NE-MOSFET QS35 is connected to a third activation signal $\phi_3$.

The third differential circuit DIFF3 also compares the potential VSA1 with the reference voltage VREF1, and amplifies a difference therebetween. When VSA1>VREF1, a node B3 between the PE-MOSFET QS31 and the NE-MOSFET QS33 becomes a low level, and when VSA1<VREF1, the node B3 becomes a high level. The node B3 constitutes an output of the third differential circuit DIFF3, and is connected to an inverting amplifier IS31, which outputs an inverted signal of the voltage of the output B3 of the third differential circuit DIFF3, to an output node D3.

A latch circuit 600 includes a first latch 601, a second latch 602 and a third latch 603. The first latch 601 receives the output D1 of the inverting amplifier IS11 and the first activation signal $\phi_1$, and has an output connected to a node E1.

The second latch 602 receives the output D2 of the inverting amplifier IS21, the second activation signal $\phi_2$, and the output E1 of the first latch 601, and has an output connected to a node E2.

The third latch 603 receives the output D3 of the inverting amplifier IS31, the third activation signal $\phi_3$, and the output E2 of the second latch 602, and has an output connected to a node E3.

A decoder circuit 700 receives the respective outputs E1, E2 and E3 of the latches 601, 602 an 603, and outputs an output of two bits Dout1 and Dout2.

Figure 4:
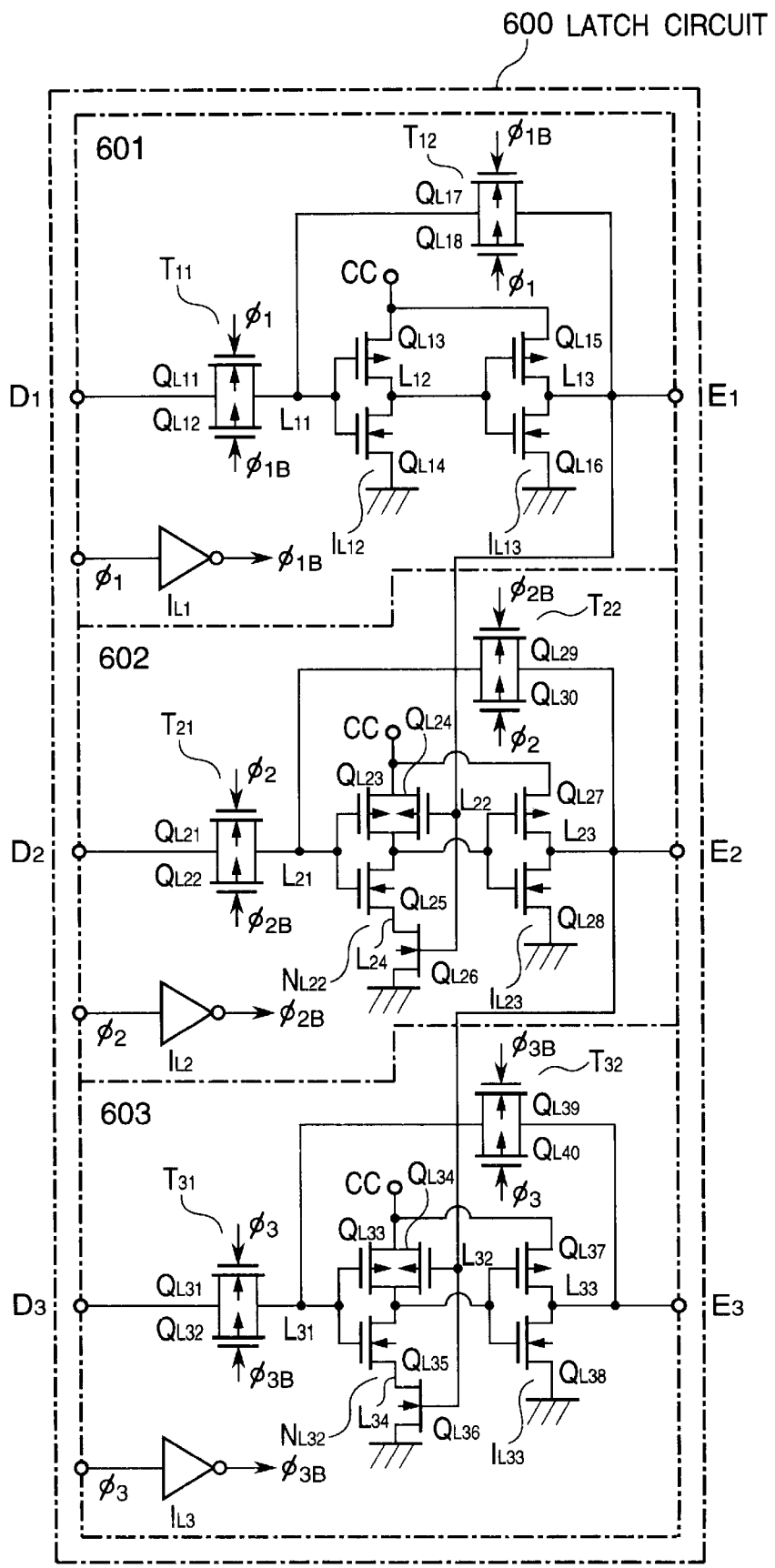
FIG. 4 is a circuit diagram of the latch circuit included in the sense sections shown in FIGS. 2 and 3.

Referring to FIG. 4, there is shown a detailed circuit diagram of the latch circuit 600.

The first latch 601 includes a transfer gate T11 composed of an NE-MOSFET QL11 connected between the input D1 and a node L11 and having a gate connected to receive the first activation signal $\phi_1$ and a PE-MOSFET QL12 connected in parallel to the NE-MOSFET QL11 and having a gate connected to receive an inverted signal $\phi_{1B}$ of the first activation signal $\phi_1$, an inverter IL12 composed of a PE-MOSFET QL13 and an NE-MOSFET QL14 series-connected between the power supply voltage terminal CC and the ground and having an input (common-connected gates of QL13 and QL14) connected to the node L11, a connection node between the PE-MOSFET QL13 and the NE-MOSFET QL14 constituting an output of the inverter IL12 and being connected to a node L12, another inverter IL13 composed of a PE-MOSFET QL15 and an NE-MOSFET QL16 series-connected between the power supply voltage terminal CC and the ground and having an input (common-connected gates of QL15 and QL16) connected to the node L11, a connection mode between the PE-MOSFET QL15 and the NE-MOSFET QL16 constituting an output of the inverter IL13 and being connected to an output node L13, another transfer gate T12 composed of an NE-MOSFET QL17 connected between the node L11 and the node L13 and having a gate connected to receive the inverted signal $\phi_{1B}$ of the first activation signal $\phi_1$ and a PE-MOSFET QL18 connected in parallel to the NE-MOSFET QL17 and having a gate connected to receive the first activation signal $\phi_1$, and an inverter IL1 having an input connected to receive the first activation signal $\phi_1$ and an output for generating the inverted signal $\phi_{1B}$ of the first activation signal $\phi_1$. The output node L13 is connected to the output E1.

Furthermore, the second latch 602 includes a transfer gate T21 composed of an NE-MOSFET QL21 connected between the input D2 and a node L21 and having a gate connected to receive the second activation signal $\phi_2$ and a PE-MOSFET QL22 connected in parallel to the NE-MOSFET QL21 and having a gate connected to receive an inverted signal $\phi_{2B}$ of the second activation signal $\phi_2$, a NAND circuit NL22 composed of a PE-MOSFET QL23 connected between the power supply voltage terminal CC and a node L22 and having a gate connected to the node L21, a PE-MOSFET QL24 connected in parallel to the PE-MOSFET QL23 and having a gate connected to the output node L13 of the first latch 601, an NE-MOSFET QL25 connected between the node L22 and a node L24 and having a gate connected to the node L21, an NE-MOSFET QL26 connected between the node L24 and the ground and having a gate connected to the output node L13 of the first latch 601, the node L22 constituting an output of the NAND circuit NL22, an inverter IL23 composed of a PE-MOSFET QL27 and an NE-MOSFET QL28 series-connected between the power supply voltage terminal CC and the ground and having an input (common-connected gates of QL27 and QL28) connected to the node L22, a connection node between the PE-MOSFET QL27 and the NE-MOSFET QL28 constituting an output of the inverter IL23 and being connected to an output node L23, another transfer gate T22 composed of an NE-MOSFET QL29 connected between the node L21 and the node L23 and having a gate connected to receive the inverted signal $\phi_{2B}$ of the second activation signal $\phi_2$ and a PE-MOSFET QL30 connected in parallel to the NE-MOSFET QL29 and having a gate connected to receive the second activation signal $\phi_2$, and an inverter IL2 having an input connected to receive the second activation signal $\phi_2$ and an output for generating the inverted signal $\phi_{2B}$ of the second activation signal $\phi_2$. The output node L23 is connected to the output E2.

Furthermore, the third latch 603 includes a transfer gate T31 composed of an NE-MOSFET QL31 connected between the input D3 and a node L31 and having a gate connected to receive the third activation signal $\phi_3$ and a PE-MOSFET QL32 connected in parallel to the NE-MOSFET QL31 and having a gate connected to receive an inverted signal $\phi_{3B}$ of the third activation signal $\phi_3$, a NAND circuit NL32 composed of a PE-MOSFET QL33 connected between the power supply voltage terminal CC and a node L32 and having a gate connected to the node L31, a PE-MOSFET QL34 connected in parallel to the PE-MOSFET QL33 and having a gate connected to the output node L23 of the second latch 603, an NE-MOSFET QL35 connected between the node L32 and a node L34 and having a gate connected to the node L31, an NE-MOSFET QL36 connected between the node L34 and the ground having a gate connected to the output node L23 of the second latch 601, the node L32 constituting an output of the NAND circuit NL32, an inverter IL33 composed of a PE-MOSFET QL37 and an NE-MOSFET QL38 series-connected between the power supply voltage terminal CC and the ground and having an input (common-connected gates of QL37 and QL38) connected to the node L32, a connection node between the PE-MOSFET QL37 and the NE-MOSFET QL38 constituting an output of the inverted IL33 and being connected to an output node L33, another transfer gate T32 decomposed of an NE-MOSFET QL39 connected between the node L31 and the node L33 and having a gate connected to receive the inverted signal $\phi_{3B}$ of the third activation signal $\phi_3$ and a PE-MOSFET QL40 connected in parallel to the NE-MOSFET QL39 and having a gate connected to receive the third activation signal $\phi_3$, and an inverter IL3 having an input connected to receive the third activation signal $\phi_3$ and an output for generating the inverted signal $\phi_{3B}$ of the third activation signal $\phi_3$. The output node L33 is connected to the output E3.

Figure 7:
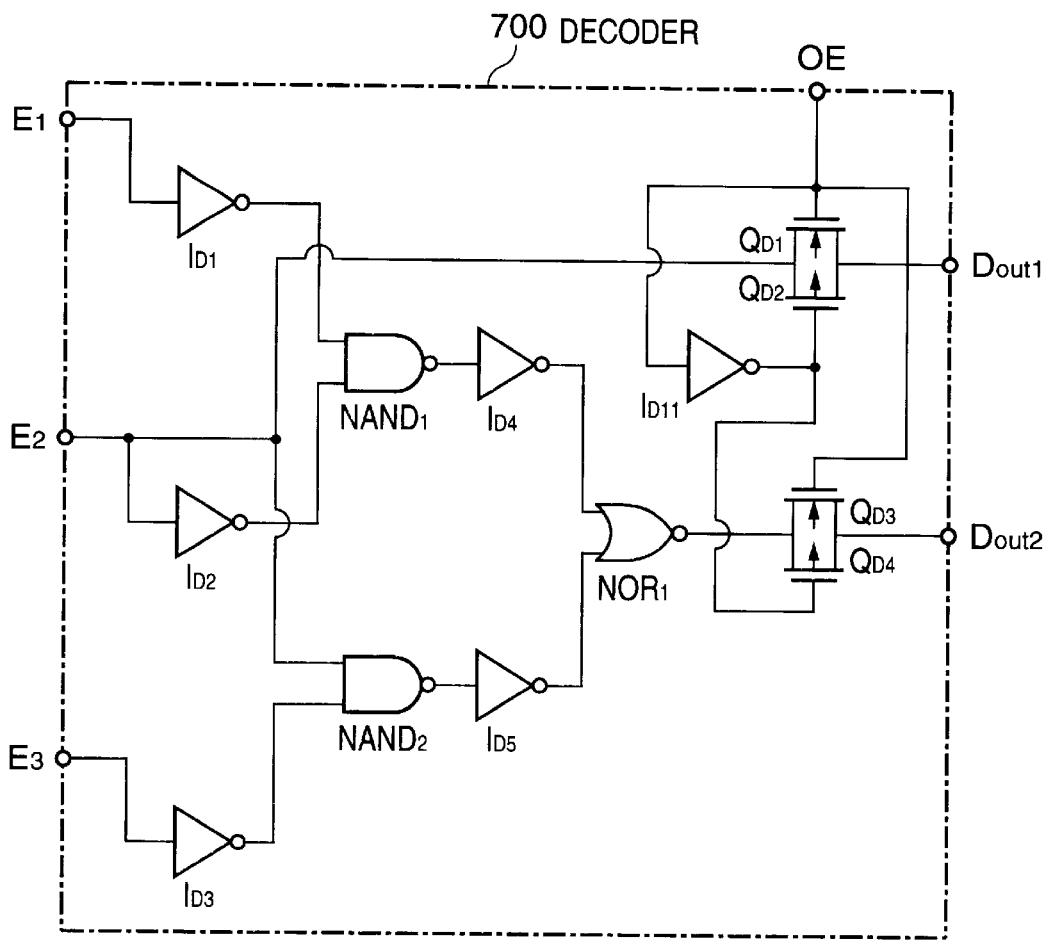
FIG. 7 is a logic circuit diagram of the decoder included in the sense sections shown in FIGS. 2 and 3.
Figure 19:
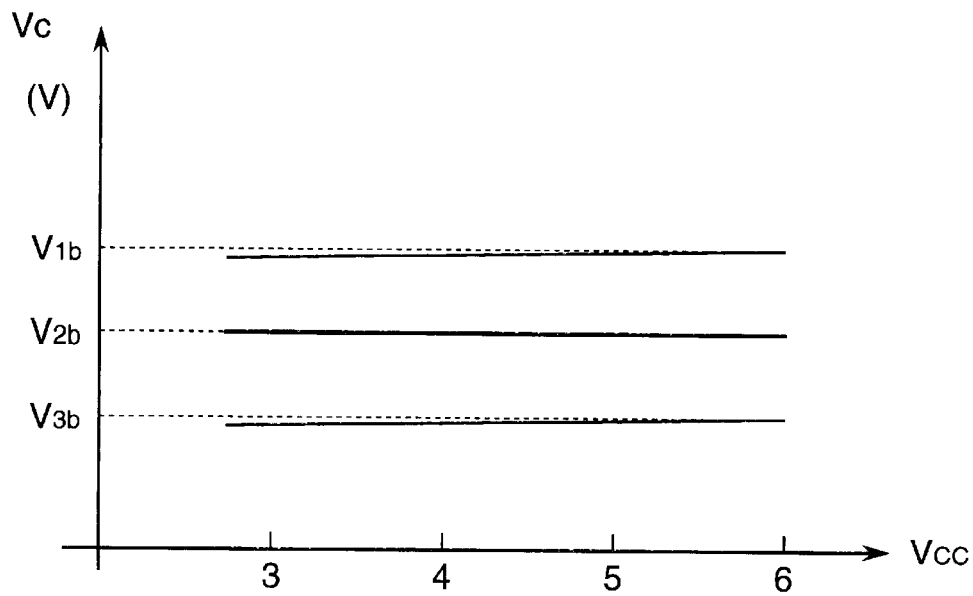
FIG. 19 is a graph illustrating the power supply voltage dependency of an output of the reference potential generating circuit.

Referring to FIG. 7, there is shown a detailed logic circuit diagram of the decoder 700. Inputs E1, E2 and E3 of the decoder 700 are connected to the respective outputs E1, E2 and E3 of the latches 601, 602 and 603, respectively, and are connected to an input of inverters ID1, ID2 and ID3, respectively. The decoder 700 also includes a NAND circuit NAND1 having inputs connected to an output of the inverters ID1 and ID2, respectively, and another NAND circuit NAND2 having inputs connected to the input E2 and an output of the inverter ID3, respectively. An output of the NAND circuit NAND1 is connected through an inverter ID4 to one input of a NOR circuit NOR1, and an output of the NAND circuit NAND2 is connected through an inverter ID5 to the other input of the NOR circuit NOR1.

The input E1 is also connected to the data output Dout1 through a transfer gate composed of an NE-MOSFET QD1 connected between the input E1 and the data output Dout1 and having a gate connected to receive the output enable signal OE and a PE-MOSFET QD2 connected in parallel to the NE-MOSFET QD1 and having a gate connected to an output of an inverter ID11 having an input connected to receive the output enable signal OE. An output of the NOR circuit NOR1 is connected to the data output Dout2 through another transfer gate composed of an NE-MOSFET QD3 connected between the output of the NOR circuit NOR1 and the data output Dout2 and having a gate connected to receive the output enable signal OE and a PE-MOSFET QD4 connected in parallel to the NE-MOSFET QD3 and having a gate connected to the output of the inverter ID11.

Now, an operation of the embodiment will be described with reference to FIGS. 1, 2 and 4 to 8.

Similarly to the prior art example, it is assumed that the memory cell can set to have any one of four thresholds, and the lowest one of the four thresholds is VT0 (0.5 V), a second lowest threshold is VT1 (1.3 V), a third lowest threshold is VT2 (2.0 V), and the highest threshold is VT3 (4.0 V).

Figures 5, 6:
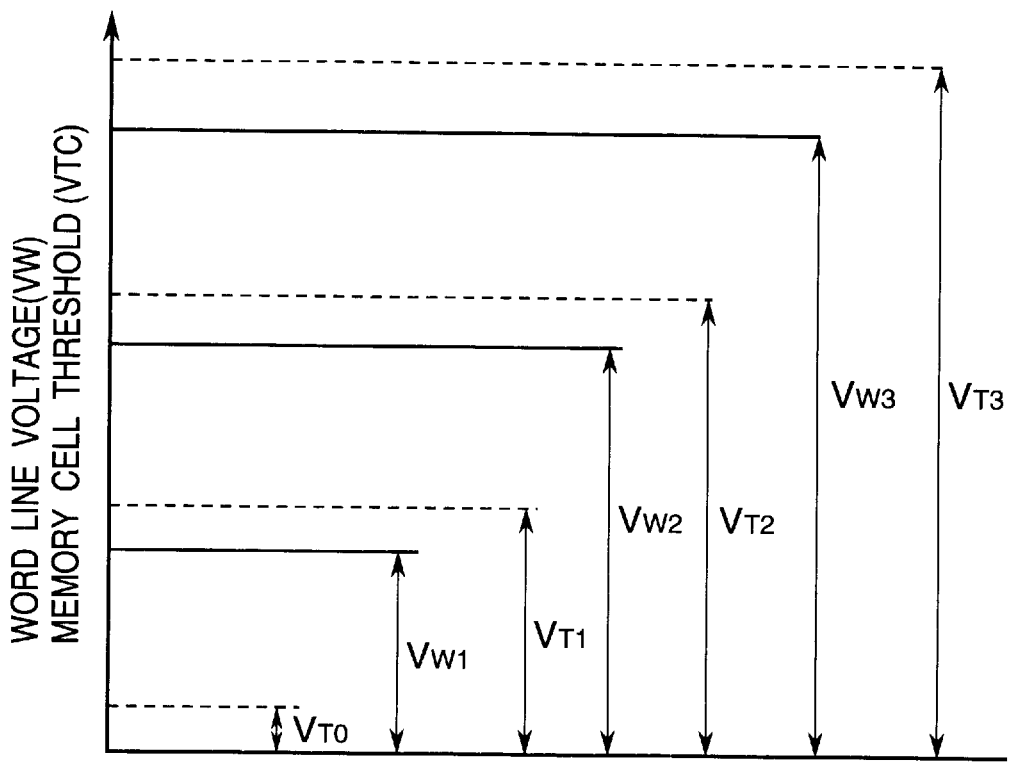
FIG. 5 is a graph illustrating a relation between various thresholds of the memory cell and different word line voltages.
FIG. 6 is a table illustrating a relation between a logic value of the output signal and the thresholds of the selected memory cell, in the first embodiment of the semiconductor memory.

In addition, in the embodiment, the voltage of the selected word line is caused to change in the named order of a first word line voltage VW1, a second word line voltage VW2 and a third word line voltage VW3, in a time-division manner. A graph of FIG. 5 illustrates a relation between the different thresholds of the memory cell and the different word line voltages. Namely, the value of VW1 is set to be slightly lower than VT1 but between VT0 and VT1. For example, the value of VW1 is set to be at 1.3 V. The value of VW2 is set to be slightly lower than VT2 but between VT1 and VT2. For example, the value of VW2 is set to be at 1.9 V. The value of VW3 is set to be between VT2 and VT3. For example, the value of VW3 is set to be at 3.3 V.

Figure 8:
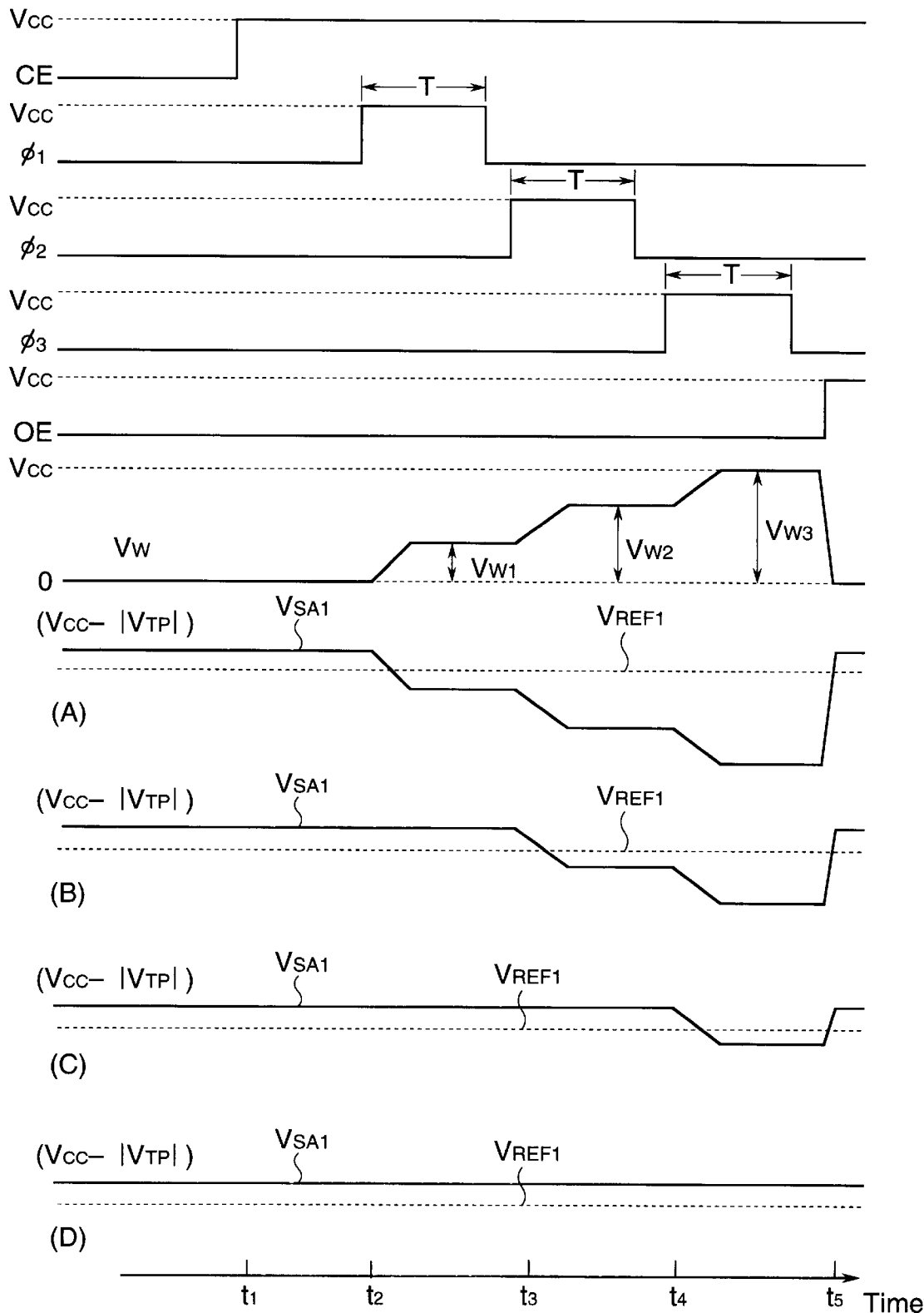
FIG. 8 is a timing waveform diagram illustrating an operation of the first embodiment of the semiconductor memory.

FIG. 8 is a timing waveform diagram of the chip enable signal CE, the output enable signal OE, the clock signals (activation signals) $\phi_1$, $\phi_2$ and $\phi_3$, the voltage VW of the selected word line and the voltage on the internal node SA1 in the sense amplifier, for the purpose of illustrating an operation of the first embodiment of the semiconductor memory.

In addition, (A) in FIG. 8 shows the waveform of VSA1 when the memory cell having the threshold VT0 is selected, and (B) in FIG. 8 shows the waveform of VSA1 when the memory cell having the threshold VT1 is selected. (C) in FIG. 8 shows the waveform of VSA1 when the memory cell having the threshold VT2 is selected, and (D) in FIG. 8 shows the waveform of VSA1 when the memory cell having the threshold VT3 is selected.

(A) When the memory cell having the threshold VT0 is selected:

(1) Time $t_1$ to $t_2$

In this period of time, the address is set, and the selected memory cell is determined.

(2) Time $t_2$ to $t_3$

In this period of time, the clock signal $\phi_1$ is brought to the high level, so that the voltage VW of the selected word line elevates to the first word line voltage VW1. In this case, since VW1>VT0, a current flows through the selected memory cell, and therefore, the potential on the node SA1 in the sense amplifier shown in FIG. 2 lowers as shown by (A) in FIG. 8.

In this period, since the first differential circuit DIFF1 is activated, and since it becomes VSA1<VREF1, the node B1 becomes the high level, and therefore, the node D1 becomes the low level. In the first latch, in addition, the transfer gate T11 is turned on, so that the data is supplied to the latch, and therefore, the output E1 becomes the low level.

Thereafter, in response to the falling edge of the clock $\phi_1$, the transfer gate T11 is turned off, and on the other hand, the transfer gate T12 is turned on, with the result that the data is latched and the node E1 maintains the data of the low level.

(3) Time $t_3$ to $t_4$

In this period of time, the clock signal $\phi_2$ is brought to the high level, so that the voltage VW of the selected word line further elevates to the second word line voltage VW2. Therefore, a further large current flows through the selected memory cell, and therefore, the potential on the node SA1 in the sense amplifier shown in FIG. 2 further lowers, in comparison with the period of time $t_2$ to $t_3$, as shown by (A) in FIG. 8.

In this period, since the second differential circuit DIFF2 is activated, and since it becomes VSA1<VREF1, the node B2 becomes the high level, and therefore, the node D2 becomes the low level. In the second latch, the transfer gate T21 is turned on, so that the data is supplied to the latch. At this time, since the output E1 of the first latch 601 is supplied to the second latch 602, and since the output E1 has been brought to the low level in the period of time $t_2$ to $t_3$, QL24 is turned on and QL26 is turned off, so that the node L22 becomes the high level and the node L23 becomes the low level. Accordingly, the output E2 becomes the low level. Thus, regardless of the potential of the input D2, the output E2 becomes the low level.

Thereafter, in response to the falling edge of the clock $\phi_2$, the transfer gate T21 is turned off, and on the other hand, the transfer gate T22 is turned on, with the result that the data is latched and the node E2 maintains the data of the low level.

(4) Time $t_4$ to $t_5$

In this period of time, the clock signal $\phi_3$ is brought to the high level, so that the voltage VW of the selected word line further elevates to the third word line voltage VW3. Therefore, a still further large current flows through the selected memory cell, and therefore, the potential on the node SA1 in the sense amplifier shown in FIG. 2 further lowers, in comparison with the period of time $t_3$ to $t_4$, as shown by (A) in FIG. 8.

In this period, since the third differential circuit DIFF3 is activated, and since it becomes VSA1<VREF1, the node B3 becomes the high level, and therefore, the node D3 becomes the low level. In the third latch, the transfer gate T31 is turned on, so that the data is supplied to the latch. At this time, since the output E2 has been brought to the low level in the period of time $t_3$ to $t_4$, QL34 is turned on and QL36 is turned off, so that the node L32 becomes the high level and the node L33 becomes the low level. Accordingly, the output E3 becomes the low level. Namely, regardless of the potential of the input D3, the output E3 becomes the low level.

Thereafter, in response to the falling edge of the clock $\phi_3$, the transfer gate T31 is turned off, and on the other hand, the transfer gate T32 is turned on, with the result that the data is latched and the node E3 maintains the data of the low level.

(5) After time $t_5$

If the output enable signal OE is brought to the high level, the MOSFETs QD1, QD2, QD3 and QD4 in the decoder shown in FIG. 7 are activated, namely, turned on, so that the inputs E1, E2 and E3 are decoded and the result of the decoding is outputted to the outputs Dout1 and Dout2. In this case, since (E1, E2, E3)=(000), data of (Dout1, Dout2) =(00) is outputted as shown in the logic value table of FIG. 6.

(B) When the memory cell having the threshold VT1 is selected:

(1) Time $t_1$ to $t_2$

In this period of time, the address is set, and the selected memory cell is determined.

(2) Time $t_2$ to $t_3$

In this period of time, the clock signal $\phi_1$ is brought to the high level, so that the voltage VW of the selected word line elevates to the first word line voltage VW1. In this case, since VW1<VT1, no current flows through the selected memory cell, and therefore, the potential on the node SA1 in the sense amplifier shown in FIG. 2 becomes equal to the voltage represented by the equation (4), as shown by (B) in FIG. 8.

In this period, since the first differential circuit DIFF1 is activated, and since it becomes VSA1>VREF1, the node B1 becomes the low level, and therefore, the node D1 becomes the high level. In the first latch, the transfer gate T11 is turned on, so that the data is supplied to the latch, and therefore, the output E1 becomes the high level.

Thereafter, in response to the falling edge of the clock $\phi_1$, the transfer gate T11 is turned off, and the transfer gate T12 is turned on, with the result that the data is latched and the node E1 maintains the data of the high level.

(3) Time $t_3$ to $t_4$

In this period of time, the clock signal $\phi_2$ is brought to the high level, so that the voltage VW of the selected word line elevates to the second word line voltage VW2. Therefore, since VW2>VT1, a current flows through the selected memory cell, and therefore, the potential on the node SA1 in the sense amplifier shown in FIG. 2 lowers as shown by (B) in FIG. 8.

In this period, since the second differential circuit DIFF2 is activated, and since it becomes VSA1<VREF1, the node B2 becomes the high level, and therefore, the node D2 becomes the low level. In the second latch, the transfer gate T21 is turned on, so that the data is supplied to the latch. At this time, since the output E1 of the first latch 601 is at the high level, QL24 is off and QL26 is turned on, so that the NAND circuit NL22 is activated. Therefore, the node L22 becomes the high level and the node L23 becomes the low level. Accordingly, the output E2 becomes the low level.

Thereafter, in response to the falling edge of the clock $\phi_2$, the transfer gate T21 is turned off, and the transfer gate T22 is turned on, with the result that the data is latched and the node E2 maintains the data of the low level.

(4) Time $t_4$ to $t_5$

In this period of time, the clock signal $\phi_3$ is brought to the high level, so that the voltage VW of the selected word line elevates to the third word line voltage VW3. Therefore, a further large current flows through the selected memory cell, and therefore, the potential on the node SA1 in the sense amplifier further lowers, in comparison with the period of time $t_3$ to $t_4$, as shown by (B) in FIG. 8.

In this period, since the third differential circuit DIFF3 is activated, and since it becomes VSA1<VREF1, the node B3 becomes the high level, and therefore, the node D3 becomes the low level. In the third latch, the transfer gate T31 is turned on, so that the data is supplied to the latch. At this time, since the output E2 of the second latch 602 has been brought to the low level in the period of time $t_3$ to $t_4$, QL34 is turned on and QL36 is turned off, so that the node L32 becomes the high level and the node L33 becomes the low level. Accordingly, the output E3 becomes the low level. Namely, regardless of the potential of the input D3, the output E3 becomes the low level.

Thereafter, in response to the falling edge of the clock $\phi_3$, the transfer gate T31 is turned off, and the transfer gate T32 is turned on, with the result that the data is latched and the node E3 maintains the data of the low level.

(5) After time $t_5$

If the output enable signal OE is brought to the high level, the MOSFETs QD1, QD2, QD3 and QD4 in the decoder shown in FIG. 7 are activated, namely, turned on, so that the inputs E1, E2 and E3 are decoded and the result of the decoding is outputted to the outputs Dout1 and Dout2. In this case, since (E1, E2, E3)=(100), data of (Dout1, Dout2) =(01) is outputted as shown in the logic value table of FIG. 6.

(C) When the memory cell having the threshold VT2 is selected:

(1) Time $t_1$ to $t_2$

In this period of time, the address is set, and the selected memory cell is determined.

(2) Time $t_2$ to $t_3$

In this period of time, the clock signal $\phi_1$ is brought to the high level, so that the voltage VW of the selected word line elevates to the first word line voltage VW1. In this case, since VW1<VT2, no current flows through the selected memory cell, and therefore, the potential on the node SA1 in the sense amplifier becomes equal to the voltage represented by the equation (4), as shown by (C) in FIG. 8.

In this period, since the first differential circuit DIFF1 is activated, and since it becomes VSA1>VREF1, the node B1 becomes the low level, and therefore, the node D1 becomes the high level. In the first latch, the transfer gate T11 is turned on, so that the data is supplied to the latch, and therefore, the output E1 becomes the high level.

Thereafter, in response to the falling edge of the clock $\phi_1$, the transfer gate T11 is turned off, and the transfer gate T12 is turned on, with the result that the data is latched and the node E1 maintains the data of the high level.

(3) Time $t_3$ to $t_4$

In this period of time, the clock signal $\phi_2$ is brought to the high level, so that the voltage VW of the selected word line elevates to the second word line voltage VW2. At this time, since VW2<VT2, no current flows through the selected memory cell, similarly to the period of time $t_2$ to $t_3$, and therefore, the potential on the node SA1 in the sense amplifier becomes equal to the voltage represented by the equation (4), as shown by (C) in FIG. 8.

In this period, since the second differential circuit DIFF2 is activated, and since it becomes VSA1>VREF1, the node B2 becomes the low level, and therefore, the node D2 becomes the high level. In the second latch, the transfer gate T21 is turned on, so that the data is supplied to the latch. At this time, since the output E1 of the first latch 601 is at the high level, QL24 is off and QL26 is turned on, so that the NAND circuit NL22 is activated. Therefore, the node L22 becomes the low level and the node L23 becomes the high level. Accordingly, the output E2 becomes the high level.

Thereafter, in response to the falling edge of the clock $\phi_2$, the transfer gate T21 is turned off, and the transfer gate T22 is turned on, with the result that the data is latched and the node E2 maintains the data of the high level.

(4) Time $t_4$ to $t_5$

In this period of time, the clock signal $\phi_3$ is brought to the high level, so that the voltage VW of the selected word line elevates to the third word line voltage VW3. At this time, since VW3>VT2, a current flows through the selected memory cell, and therefore, the potential on the node SA1 in the sense amplifier lowers as shown by (C) in FIG. 8.

In this period, since the third differential circuit DIFF3 is activated, and since it becomes VSA1<VREF1, the node B3 becomes the high level, and therefore, the node D3 becomes the low level. In the third latch, the transfer gate T31 is turned on, so that the data is supplied to the latch. At this time, since the output E2 of the second latch 602 supplied to the third latch 603 is at the high level, the NAND circuit NL32 is activated, so that the node L32 becomes the high level and the node L33 becomes the low level. Accordingly, the output E3 becomes the low level.

Thereafter, in response to the falling edge of the clock $\phi_3$, the transfer gate T31 is turned off, and the transfer gate T32 is turned on, with the result that the data is latched and the node E3 maintains the data of the low level.

(5) After time $t_5$

If the output enable signal OE is brought to the high level, the MOSFETs QD1, QD2, QD3 and QD4 in the decoder shown in FIG. 7 are activated, namely, turned on, so that the inputs E1, E2 and E3 are decoded and the result of the decoding is outputted to the outputs Dout1 and Dout2. In this case, since (E1, E2, E3)=(110), data of (Dout1, Dout2) =(10) is outputted as shown in the logic value table of FIG. 6.

(D) When the memory cell having the threshold VT3 is selected:

(1) Time $t_1$ to $t_2$

In this period of time, the address is set, and the selected memory cell is determined.

(2) Time $t_2$ to $t_3$

In this period of time, the clock signal $\phi_1$ is brought to the high level, so that the voltage VW of the selected word line elevates to the first word line voltage VW1. In this case, since VW1<VT3, no current flows through the selected memory cell, and therefore, the potential on the node SA1 in the sense amplifier becomes equal to the voltage represented by the equation (4), as shown by (D) in FIG. 8.

In this period, since the first differential circuit DIFF1 is activated, and since it becomes VSA1>VREF1, the node B1 becomes the low level, and therefore, the node D1 becomes the high level. In the first latch, the transfer gate T11 is turned on, so that the data is supplied to the latch, and therefore, the output E1 becomes the high level.

Thereafter, in response to the falling edge of the clock $\phi_1$, the transfer gate T11 is turned off, and the transfer gate T12 is turned on, with the result that the data is latched and the node E1 maintains the data of the high level.

(3) Time $t_3$ to $t_4$

In this period of time, the clock signal $\phi_2$ is brought to the high level, so that the voltage VW of the selected word line elevates to the second word line voltage VW2. At this time, since VW2<VT3, no current flows through the selected memory cell, similarly to the period of time $t_2$ to $t_3$, and therefore, the potential on the node SA1 in the sense amplifier becomes equal to the voltage represented by the equation (4), as shown by (D) in FIG. 8.

In this period, since the second differential circuit DIFF2 is activated, and since it becomes VSA1>VREF1, the node B2 becomes the low level, and therefore, the node D2 becomes the high level. In the second latch, the transfer gate T31 is turned on, so that the data is supplied to the latch. At this time, since the output E1 of the first latch 601 is at the high level, QL24 is off and QL26 is turned on, so that the NAND circuit NL22 is activated. Therefore, the node L22 becomes the low level and the node L23 becomes the high level. Accordingly, the output E2 becomes the high level.

Thereafter, in response to the falling edge of the clock $\phi_2$, the transfer gate T21 is turned off, and the transfer gate T22 is turned on, with the result that the data is latched and the node E2 maintains the data of the high level.

(4) Time $t_4$ to $t_5$

In this period of time, the clock signal $\phi_3$ is brought to the high level, so that the voltage VW of the selected word line elevates to the third word line voltage VW3. At this time, since VW3<VT3, no current flows through the selected memory cell, and therefore, the potential on the node SA1 in the sense amplifier becomes equal to the voltage represented by the equation (4), similarly to the period of time $t_3$ to $t_4$, as shown by (D) in FIG. 8.

In this period, since the third differential circuit DIFF3 is activated, and since it becomes VSA1>VREF1, the node B3 becomes the low level, and therefore, the node D3 becomes the high level. In the third latch 603, the transfer gate T31 is turned on, so that the data is supplied to the latch. At this time, since the output E2 of the second latch 602 is supplied to the third latch 603 is at the high level, QL34 is off and QL36 is on, so that the NAND circuit NL32 is activated. Therefore, the node L32 becomes the low level and the node L33 becomes the high level. Accordingly, the output E3 becomes the high level.

Thereafter, in response to the falling edge of the clock $\phi_3$, the transfer gate T31 is turned off, and the transfer gate T32 is turned on, with the result that the data is latched and the node E3 maintains the data of the high level.

(5) After time $t_5$

If the output enable signal OE is brought to the high level, the MOSFETs QD1, QD2, QD3 and QD4 in the decoder shown in FIG. 7 are activated, namely, turned on, so that the inputs E1, E2 and E3 are decoded and the result of the decoding is outputted to the outputs Dout1 and Dout2. In this case, since (E1, E2, E3)=(111), data of (Dout1, Dout2)=(11) is outputted as shown in the logic value table of FIG. 6.

Now, description will be made on the operation of the first embodiment of the semiconductor memory, in the case that the power supply voltage varies because of noises in the period of time $t_4$ to $t_5$ when the memory cell having the threshold VT1 is selected, similarly to the situation of the prior art example.

Figure 9:
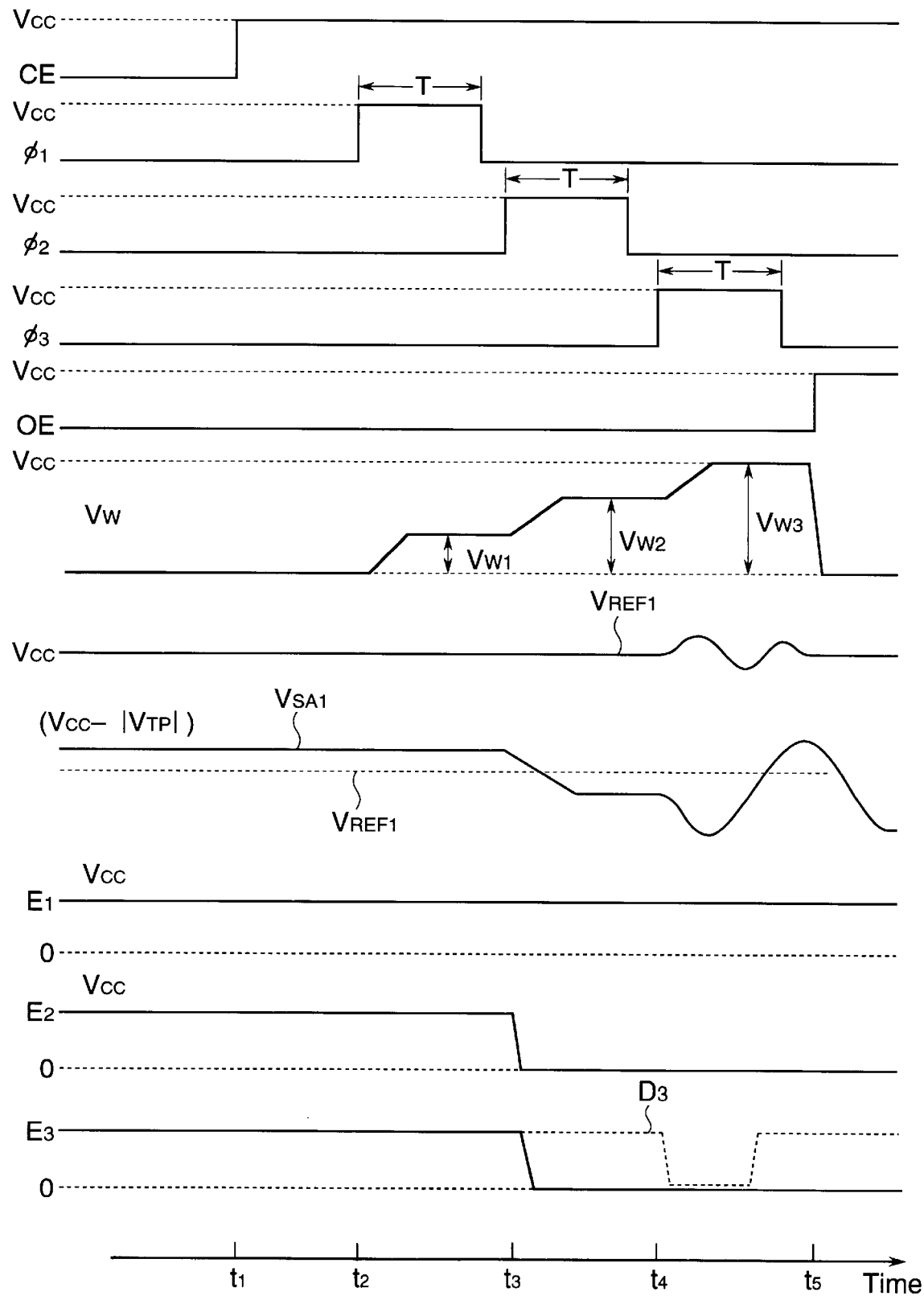
FIG. 9 is a timing waveform diagram illustrating an operation of the first embodiment of the semiconductor memory, in the case that the power supply voltage varies because of noises when the memory cell having the threshold VT1 is selected.

FIG. 9 is a timing waveform diagram, in this situation, of the chip enable signal CE, the output enable signal OE, the clock signals (activation signals) $\phi_1$, $\phi_2$ and $\phi_3$, the voltage VW of the selected word line, the voltage on the internal node SA1 in the sense amplifier, the power supply voltage VCC, and potentials of the outputs E1, E2 and E3 of the latch circuit.

Since the operation from time $t_1$ to $t_3$ is completely the same as the above mentioned operation, explanation will be omitted for simplification of description.

(1) Time $t_3$ to $t_4$

As mentioned above, in this period of time, since it becomes VSA1<VREF1, the output E2 becomes the low level. Therefore, in the third latch 603 shown in FIG. 4, QL34 is turned on and QL36 is turned off so that the node L32 becomes the high level and the node L33 becomes the low level. Accordingly, as shown by the waveform E3 in FIG. 9, the output E3 becomes the low level. In other words, the data input to the third latch circuit should be originally performed in the period of time $t_4$ to $t_5$, however, if the output E2 becomes the low level, the third latch receives the low level data of the output E2 in the period of time $t_3$ to $t_4$, and then, sets the output E3 to the low level.

(4) Time $t_4$ to $t_5$

In this period of time, as shown in the waveform of the power supply voltage VCC in FIG. 9, the power supply voltage VCC varies because of noises. As mentioned hereinafter in connection with the prior art example, this variation in the power supply voltage VCC causes the voltage VSA1 on the internal node SA1 to vary. At this time, since the third differential circuit DIFF3 is activated, during a period of VSA1<VREF1, the node B3 becomes the high level, and therefore, the node D3 becomes the low level, as shown by the waveform D3 in FIG. 9. But, during a period of VSA1>VREF1, the node B3 becomes the low level, and therefore, the node D3 becomes the high level, so that the third differential circuit DIFF3 causes an erroneous operation. However, since the third latch 603 is in such a condition that QL34 is turned on and QL36 is turned off, and therefore, the output E3 is maintained at the low level. Namely, regardless of how the value of the input D3 varies, the output E3 of the third latch continues to output the low level.

(5) After time $t_5$

In this case, since (E1, E2, E3)=(100), data of (Dout1, Dout2)=(01) is outputted as shown in the logic value table of FIG. 6.

As mentioned above, in the first embodiment of the semiconductor memory in accordance with the present invention, even if the power supply voltage varies because of noises during the period of time $t_4$ to $t_5$, if the memory cell having the threshold VT1 is selected, a correct data reading can be obtained.

In addition, when the memory cell having the threshold VT0 is selected, even if the power supply voltage varies because of noises during the period of time $t_3$ to $t_4$ or during the period of time $t_4$ to $t_5$, a correct data reading can be obtained. Because, the output E1 becomes the low level during the period of time $t_2$ to $t_3$, and therefore, the output E1 of the low level makes the data of the output E3 to the low level. Therefore, even if the data of inputs D2 and D3 varies because of the power supply voltage noises, the outputs E2 and E3 are maintained at the low level.

Figure 3:
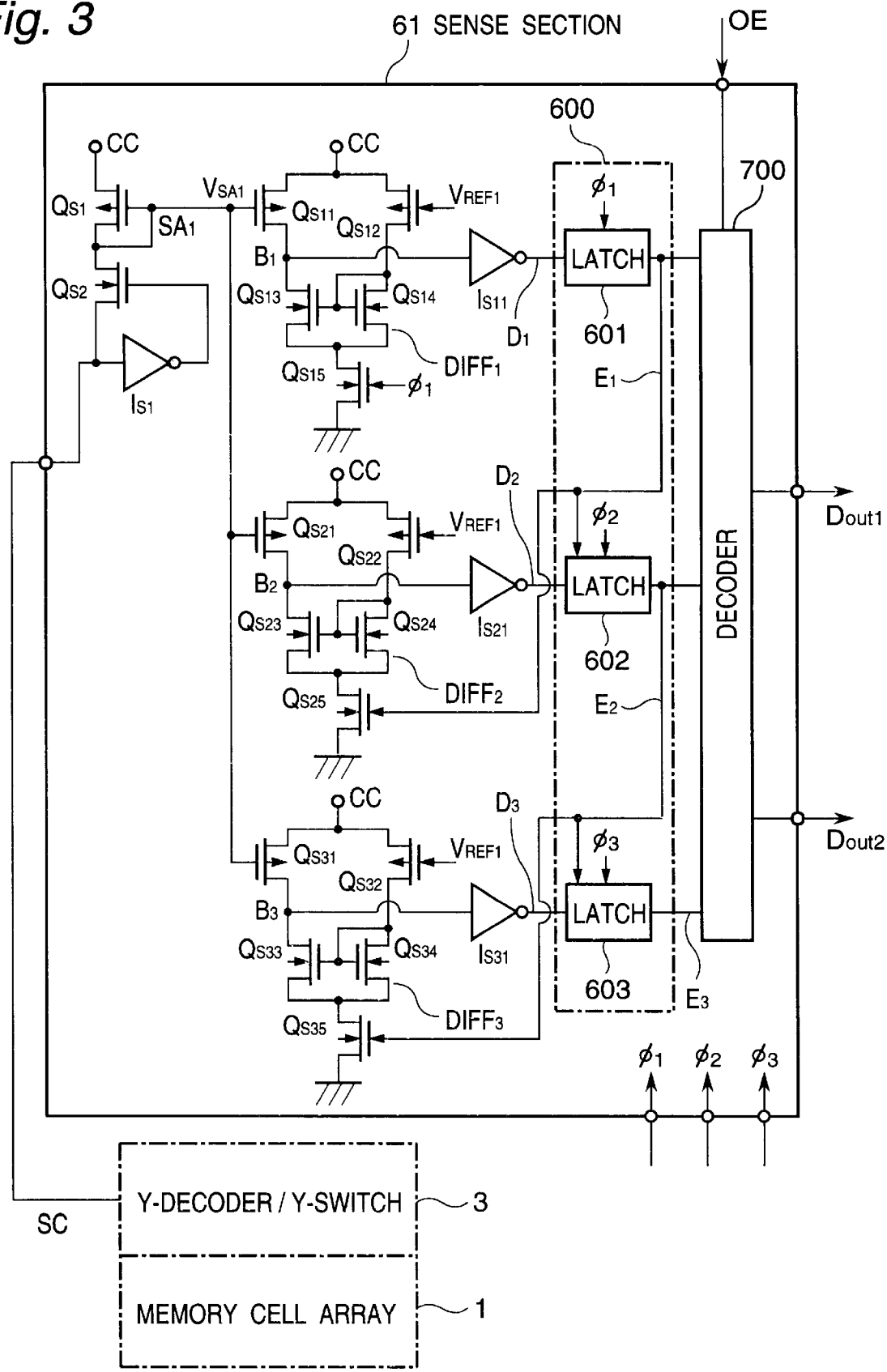
FIG. 3 is a circuit diagram of a modification of the sense section shown in FIG. 2.

Next, a modification of the first embodiment will be described. FIG. 3 is a circuit diagram of a modification of the sense section shown in FIG. 2. In FIG. 3, elements corresponding to those shown in FIG. 2 are given the same Reference Numerals and Signs, and explanation thereof will be omitted for the simplification of description.

As seen from comparison between FIGS. 2 and 3, a sense section, generally designated with Reference Numeral 61 in FIG. 3, is different from the sense section 60 shown in FIG. 2 in that the gate of the NE-MOSFET QS25 in the second differential circuit DIFF2 is controlled by the output E1 of the first latch 601, and the gate of the NE-MOSFET QS35 in the third differential circuit DIFF3 is controlled by the output E2 of the second latch 602.

According to the logic value table of FIG. 6, when the memory cell having the threshold VT0 is selected, the output E1 of the first latch 601 becomes the low level, with the result that the output E2 of the first latch 602 becomes the low level and then the output E3 of the first latch 603 becomes the low level. In this case, accordingly, it is not necessary to supply the data read out from the memory cell, to the input D2 of the latch 602 and to the input D3 of the latch 603. Therefore, there is no problem even if the second differential circuit DIFF2 and the third differential circuit DIFF3 are maintained in an inactive condition. Therefore, it is possible to control the NE-MOSFET QS25 by the output E1 of the first latch 601, and to control the NE-MOSFET QS35 by the output E2 of the second latch 602.

Further, when the memory cell having the threshold VT1 is selected, the output E2 of the first latch 602 becomes the low level, with the result that the output E3 of the first latch 603 becomes the low level. In this case, accordingly, it is not necessary to supply the data read out from the memory cell, to the input D3 of the latch 603. Therefore, there is no problem even if the third differential circuit DIFF3 is maintained in an inactive condition. Therefore, it is possible to control the NE-MOSFET QS35 by the output E2 of the second latch 602.

As mentioned above, in the modification shown in FIG. 3 of the first embodiment, when the memory cell having the threshold VT0 is selected, it is possible to deactivate the second differential circuit DIFF2 and the third differential circuit DIFF3, and when the memory cell having the threshold VT1 is selected, it is possible to deactivate the third differential circuit DIFF3. Therefore, a current consumption can be reduced in comparison with the prior art example.

Now, a second embodiment of the semiconductor memory in accordance with the present invention will be described with reference to FIGS. 10 and 11. The first embodiment of the semiconductor memory in accordance with the present invention is so configured that when the selected memory cell is conductive, the outputs E1, E2 and E3 of the respective latches become the low level ("0"), and when the selected memory cell is nonconductive, the outputs E1, E2 and E3 of the respective latches become the high level ("1"). The second embodiment of the semiconductor memory in accordance with the present invention is so configured that when the selected memory cell is conductive, the outputs E1, E2 and E3 of the respective latches become the high level ("1"), and when the selected memory cell is nonconductive, the outputs E1, E2 and E3 of the respective latches become the low level ("0").

Figures 11, 12:
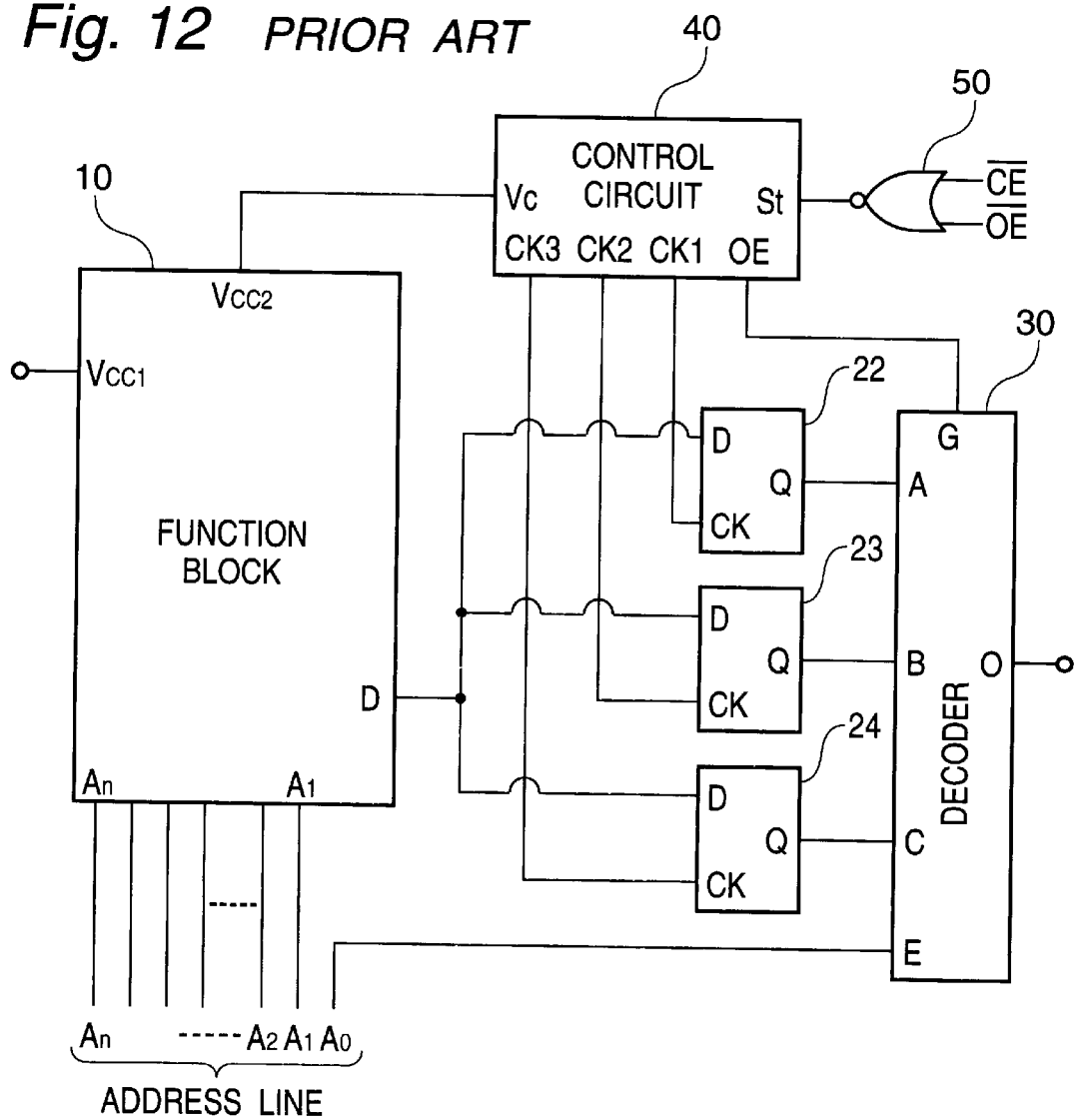
FIG. 11 is a table illustrating a relation between a logic value of the output signal and the thresholds of the selected memory cell, in the second embodiment of the semiconductor memory.
FIG. 12 is a block diagram of the prior art semiconductor memory storing multivalue information.
Figures 13, 14:
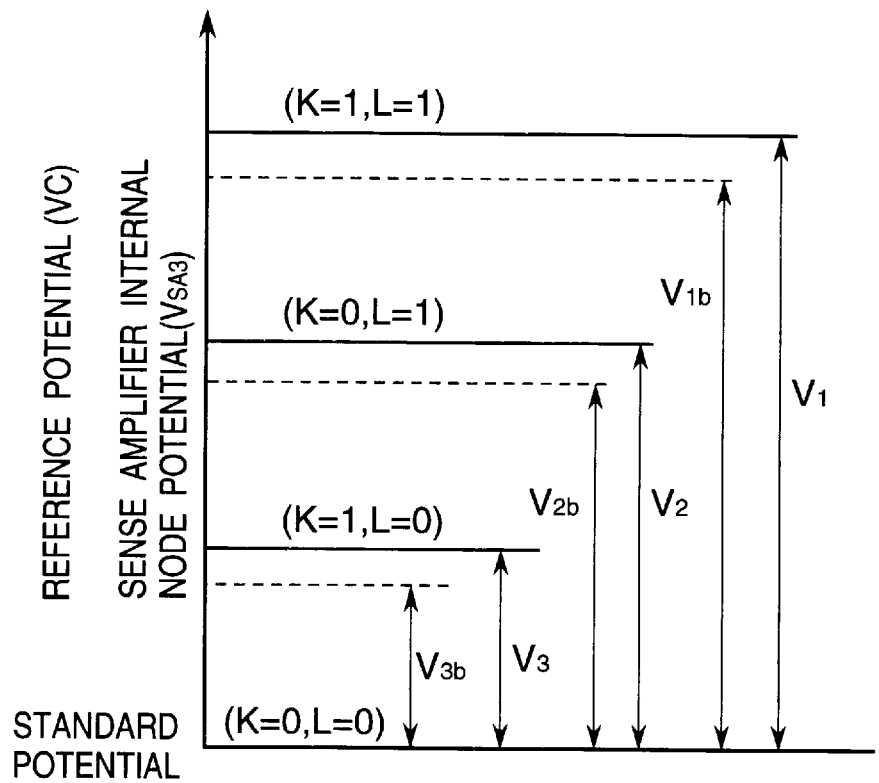
FIG. 13 is a table illustrating a relation between a logic value of various output signals and the potentials of the selected memory cell, in the prior art semiconductor memory.
FIG. 14 is a graph illustrating a relation between the potential of the internal node in the sense amplifier and the reference potentials, in the prior art semiconductor memory.

FIG. 11 is a table illustrating a logic value of the outputs E1, E2 and E3 of the latches and the outputs Dout1 and Dout2 of the decoder, generated dependently upon the threshold VT of the selected memory cell, in the second embodiment of the semiconductor memory.

Figure 10:
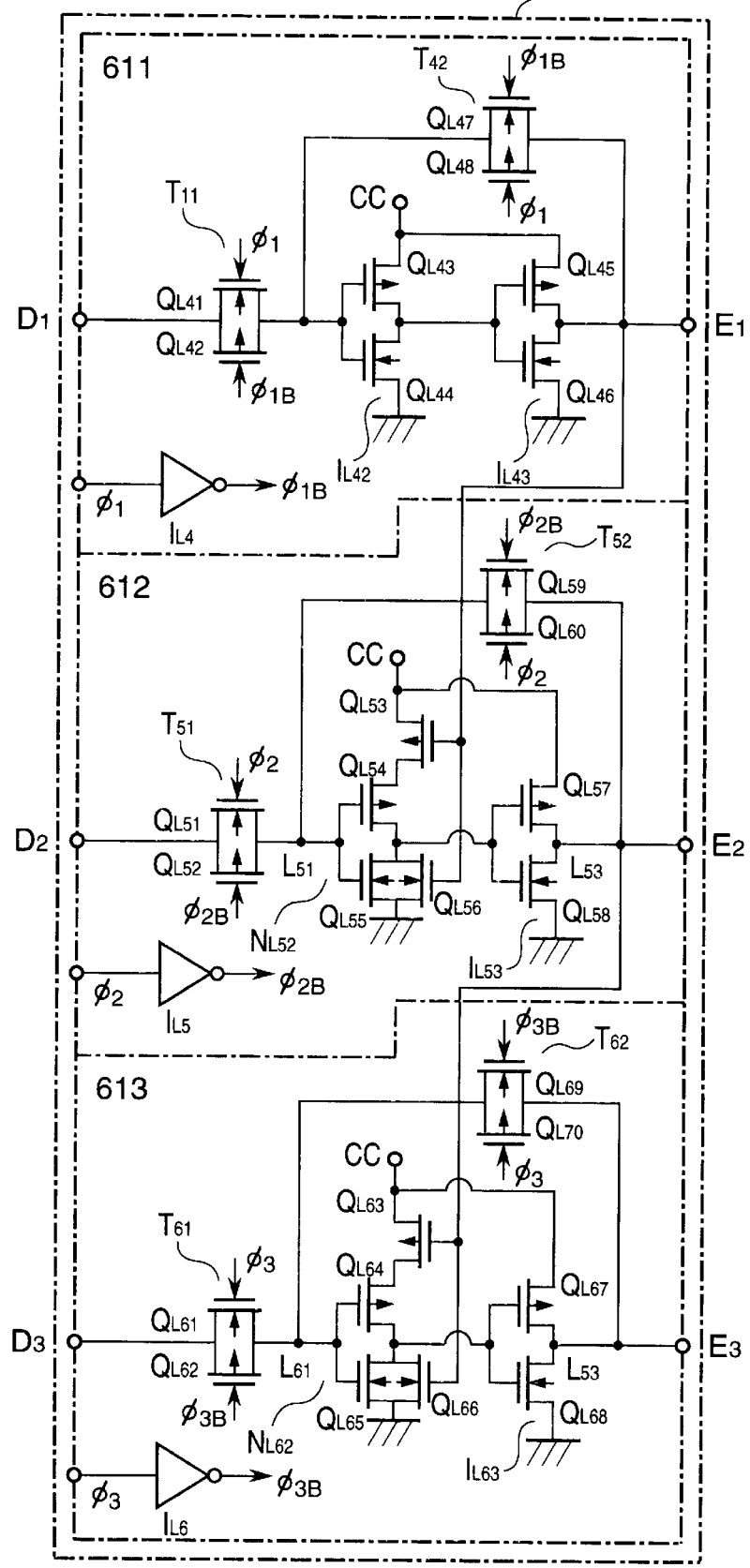
FIG. 10 is a circuit diagram of the latch circuit included in the sense section of a second embodiment of the semiconductor memory in accordance with the present invention.

Referring to FIG. 10, which is a circuit diagram of the latch circuit included in the sense section of the second embodiment of the semiconductor memory in accordance with the present invention, the latch circuit of the second embodiment is generally designated with Reference Numerals 610, includes there latches, similarly to the first embodiment. Namely, the latch circuit 610 includes a first latch 611, a second latch 612 and a third latch 613.

The first latch 61 has the same construction as that of the first latch 601 of the first embodiment, and therefore, explanation will be omitted by substituting "4" for "1" succeeding to "L" included in various Reference Signs.

The second latch 612 includes a NOR circuit ML52, which includes a PE-MOSFET QL53 connected between the power supply voltage terminal CC and a node L54 and having a gate connected to the output E1 of the first latch 611, a PE-MOSFET QL54 connected between the node L54 and a node L52 and having a gate connected to a node L51, an NE-MOSFET QL55 connected between the node L52 and the ground and having a gate connected to the node L51, and an NE-MOSFET QL56 connected in parallel to the NE-MOSFET QL55 and having a gate connected to the output E1 of the first latch 611. The second latch 612 has the same construction as that of the second latch 602 of the first embodiment, excepting that the NOR circuit ML52 is provided in place of the NAND circuit NL22. Therefore, further explanation will be omitted by substituting "5" for "2" succeeding to "L" included in various Reference Signs.

The third latch 613 includes a NOR circuit ML62, which includes a PE-MOSFET QL63 connected between the power supply voltage terminal CC and a node L64 and having a gate connected to the output E2 of the second latch 612, a PE-MOSFET QL64 connected between the node L64 and a node L62 and having a gate connected to a node L61, an NE-MOSFET QL65 connected between the node L62 and the ground and having a gate connected to the node L61, and an NE-MOSFET QL66 connected in parallel to the NE-MOSFET QL65 and having a gate connected to the output E2 of the second latch 612. The third latch 613 has the same construction as that of the third latch 603 of the first embodiment, excepting that the NOR circuit ML62 is provided in place of the NAND circuit NL32. Therefore, further explanation will be omitted by substituting "6" for "3" succeeding to "L" included in various Reference Signs.

In this second embodiment, the logic values of the outputs E1, E2 and E3 of the latches 611, 612 and 613 are determined dependently upon the threshold of the selected memory cell, as shown in the logic value table of FIG. 11. Accordingly, it is necessary that when the threshold of the selected memory cell is VT0, if the output E1 of the first latch 611 outputs the high level, the output E2 of the second latch 612 outputs the high level in response to the output E1 of the high level and the output E3 of the third latch 613 also outputs the high level. In addition, it is also necessary that when the threshold of the selected memory cell is VT1, if the output E2 of the second latch 612 outputs the high level, the output E3 of the third latch 613 outputs the high level in response to the output E2 of the high level.

Now, the operation in this situation will be described with reference to FIG. 10. Since the operation in the other situation is apparent from the operation explanation in connection with the first embodiment, explanation thereof will be omitted.

In order that when the memory cell becomes conductive, the output E1 of the first latch 611 outputs the high level, the circuit shown in FIG. 3 is so modified that two cascade-connected inverters are connected, in place of the inverter IS11, between the node B1 and the node D1, two cascade-connected inverters are connected, in place of the inverter IS21, between the node B2 and the node D2, and two cascade-connected inverters are connected, in place of the inverter IS31, between the node B3 and the node D3.

(1) When the memory cell having the threshold VT0 is selected

In a period of time $t_2$ to $t_3$, the output E1 of the first latch 611 becomes the high level. In response to the high level of the output E1, QL53 in the second latch 612 is turned off and QL56 is turned on, so that the node L52 becomes the low level and the node L53 becomes the high level. Thus, the output E2 of the second latch 612 becomes the high level. Furthermore, in response to the high level of the output E2, QL63 in the third latch 613 is turned off and QL66 is turned on, so that the node L62 becomes the low level and the node L63 becomes the high level. Thus, the output E3 of the third latch 613 becomes the high level.

Accordingly, in a period of time $t_3$ to $t_4$, or in a period of time $t_4$ to $t_5$, even if the power supply voltage varies because of noises which results in variation of the potential of the input D2 of the second latch 612 and in variation of the potential of the input D3 of the third latch 613, it becomes (E1, E2, E3)=(111), and therefore, a normal reading can be obtained.

(2) When the memory cell having the threshold VT1 is selected

In a period of time $t_3$ to $t_4$, the output E2 of the second latch 612 becomes the high level. In response to the high level of the output E2, QL63 in the third latch 613 is turned off and QL66 is turned on, so that the node L62 becomes the low level and the node L63 becomes the high level. Thus, the output E3 of the third latch 613 becomes the high level.

Accordingly, in the period of time $t_4$ to $t_5$, even if the power supply voltage varies because of noises which result in variation of the potential of the input D3 of the third latch 613, it becomes (E1, E2, E3)=(011), and therefore, a normal reading can be obtained.

As mentioned above, a first advantage of the present invention is that the semiconductor memory in accordance with the present invention is highly resistive to power supply voltage noises.

The reason for this is that: For example, if the "0" level (low level) is latched in and outputted from the first latch, the output of the second latch is forcibly brought to the "0" level in response to the "0" level of the output of the first latch, and if the "0" level is latched in and outputted from the second latch, the output of the third latch is forcibly brought to the "0" level in response to the "0" level of the output of the second latch.

A second advantage of the present invention is that the semiconductor memory in accordance with the present invention has a reduced current consumption.

The reason for this is that: When the memory cell having the threshold VT0 is selected, the differential amplifiers DIFF2 and DIFF3 are maintained in an inactive condition, and when the memory cell having the threshold VT1 is selected, the differential amplifier DIFF3 is maintained in the inactive condition.

The invention has thus been shown and described with reference to the specific embodiments. However, it should be noted that the present invention is in no way limited to the details of the illustrated structures but changes and modifications may be made within the scope of the appended claims.

I claim:

1. An improved semiconductor memory including a memory cell array, an X decoder, a Y decoder/Y switch, a sense section and a timing signal generator, wherein the improvement is that said sense section includes first, second and third differential circuits operating at a timing different from each other in a time-division manner, and first, second and third latches for latching an output of said first, second and third differential circuits, respectively, said first, second and third latches being connected in such a manner that said second latch is fixed in accordance with a predetermined output level of said first latch, and said third latch is fixed in accordance with a predetermined output level of said second latch.

2. A semiconductor memory claimed in claim 1 wherein said predetermined output level is a low level.

3. A semiconductor memory claimed in claim 1 wherein said predetermined output level is a high level.

4. A semiconductor memory claimed in claim 1 wherein said second differential circuit is activated by an output of said first latch, and said third differential circuit is activated by an output of said second latch.

5. A semiconductor memory claimed in claim 1 wherein said memory cell array includes a plurality of memory cells, each of which is set to have a threshold corresponding to any one of first, second, third and fourth thresholds, and wherein said memory cell array includes a plurality of word lines, which are alternatively supplied in order with a first word line voltage, a second word line voltage and a third word line voltage, said first word line voltage being set to be between said first and second thresholds, said second word line voltage being set to be between said second and third thresholds, and said third word line voltage being set to be between said third and fourth thresholds.

6. A semiconductor memory comprising:
- a memory cell array includes a plurality of word lines, a plurality of digit lines and a plurality of memory cells located at intersections between said word lines and said digit lines;
- a timing signal generator for generating a first clock, a second clock and a third clock in order at different timings, respectively;
- an X decoder receiving a given X address, for determining a word line to be selected in accordance with said given X address, said X decoder driving said selected word line with a first word line voltage, a second word line voltage and a third word line voltage in synchronism with said first clock, said second clock and said third clock, respectively, in a time-division manner;
- a Y decoder/Y switch circuit receiving a given Y address, for determining a digit line to be selected in accordance with said given Y address; and
- a sense section receiving a signal on the digit line selected by said Y decoder/Y switch circuit, and controlled by said first, second and third clocks to process the received signal, for outputting information stored in a selected memory cell designated by said given X address and said given Y address, to an output terminal at a timing designated by an output enable signal, said sense section including:
- a biasing means connected to the digit line selected by said Y decoder/Y switch circuit, for generating an output voltage changing in accordance with a current flowing through said selected memory cell;
- a first differential amplifying circuit activated by said first clock to compare said output voltage of said biasing means with a reference potential and to amplify a difference therebetween;
- a second differential amplifying circuit activated by said second clock to compare said output voltage of said biasing means with said reference potential and to amplify a difference therebetween;
- a third differential amplifying circuit activated by said third clock to compare said output voltage of said biasing means with said reference potential and to amplify a difference therebetween;
- a first latch receiving an output of said first differential amplifying circuit, for latching said output of said first differential amplifying circuit in synchronism with said first clock;
- a second latch receiving an output of said second differential amplifying circuit, for latching said output of said second differential amplifying circuit in synchronism with said second clock, said second latch being also controlled by an output of said first latch in such a manner that when said output of said first latch is at a predetermined level, an output of said second latch is also fixed to said predetermined level;
- a third latch receiving an output of said third differential amplifying circuit, for latching said output of said third differential amplifying circuit in synchronism with said third clock, said third latch being also controlled by said output of said second latch in such a manner that when said output of said second latch is at said predetermined level, an output of said third latch is also fixed to said predetermined level; and
- a decoder circuit receiving said outputs of said first, second and third latches for decoding said outputs of said first, second and third latches into information of two bits, said decoder circuit outputting said information of two bits to said output terminal in response to said output enable signal.

7. A semiconductor memory claimed in claim 6 wherein said second differential amplifying circuit is activated by said output of said first latch in place of said second clock, and said third differential amplifying circuit is activated by said output of said second latch in place of said third clock.

8. A semiconductor memory claimed in claim 6 wherein said second latch is controlled by said output of said first latch in such a manner that when said output of said first latch is at a low level, said output of said second latch is fixed to said low level, and said third latch is controlled by said output of said second latch in such a manner that when said output of said second latch is at said low level, said output of said third latch is fixed to said low level.

9. A semiconductor memory claimed in claim 6 wherein said second latch is controlled by said output of said first latch in such a manner that when said output of said first latch is at a high level, said output of said second latch is fixed to said high level, and said third latch is controlled by said output of said second latch in such a manner that when said output of said second latch is at said high level, said output of said third latch is fixed to said high level.

10. A semiconductor memory claimed in claim 6 wherein each of said plurality of memory cells is set to have a threshold corresponding to any one of first, second, third and fourth thresholds, and wherein said first word line voltage is set to be between said first and second thresholds, said second word line voltage is set to be between said second and third thresholds, and said third word line voltage is set to be between said third and fourth thresholds.

* * * * *